(12) United States Patent
Gutsche et al.

(10) Patent No.: US 6,693,016 B2
(45) Date of Patent: Feb. 17, 2004

(54) METHOD OF FABRICATING A TRENCH-STRUCTURE CAPACITOR DEVICE

(75) Inventors: Martin Gutsche, Dorfen (DE);
Thomas Hecht, Dresden (DE);
Matthias Leonhardt, Stuttgart (DE);
Uwe Schröder, Dresden (DE); Harald Seidl, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/233,690

(22) Filed: Sep. 3, 2002

(65) Prior Publication Data

US 2003/0045068 A1 Mar. 6, 2003

(30) Foreign Application Priority Data

Aug. 31, 2001 (DE) ........................................ 101 42 580.5

(51) Int. Cl.$^7$ ............................................... H01L 21/20
(52) U.S. Cl. .................. 438/386; 438/240; 438/253; 438/396; 438/239; 438/243; 438/246
(58) Field of Search ................................ 438/240, 253, 438/396, 386, 239, 243, 246

(56) References Cited

U.S. PATENT DOCUMENTS

| | | | | |
|---|---|---|---|---|
| 5,394,000 A | * | 2/1995 | Ellul et al. .................. 257/301 |
| 5,770,484 A | * | 6/1998 | Kleinhenz ..................... 438/155 |
| 5,976,928 A | * | 11/1999 | Kirlin et al. ................. 438/240 |
| 6,034,390 A | * | 3/2000 | Tews ........................... 257/301 |
| 6,100,130 A | | 8/2000 | Iba et al. |
| 6,297,088 B1 | * | 10/2001 | King ............................ 438/243 |
| 6,319,787 B1 | * | 11/2001 | Enders et al. ............... 438/386 |
| 6,326,275 B1 | * | 12/2001 | Harrington et al. .......... 438/386 |
| 6,455,369 B1 | * | 9/2002 | Forster et al. .............. 438/249 |

FOREIGN PATENT DOCUMENTS

| | | |
|---|---|---|
| EP | 0 856 879 A1 | 8/1998 |
| WO | WO 01/17014 A1 | 3/2001 |

* cited by examiner

Primary Examiner—Matthew Smith
Assistant Examiner—Victor V Yevsikov
(74) Attorney, Agent, or Firm—Laurence A. Greenberg; Werner H. Stemer; Ralph E. Locher

(57) ABSTRACT

The novel trench capacitors have a constant or increased capacitance. Materials for a second electrode region and if appropriate a first electrode region include a metallic material, a metal nitride, or the like, and/or a dielectric region is formed with a material with an increased dielectric constant. An insulation region is formed in the upper wall region of the trench after the first electrode region or the second electrode region has been formed, by selective and local oxidation.

14 Claims, 22 Drawing Sheets

METHOD OF FABRICATING A TRENCH-STRUCTURE CAPACITOR DEVICE

BACKGROUND OF THE INVENTION

Field of the Invention

The invention lies in the semiconductor technology field. More specifically, the invention relates to a method for fabricating a trench-structure capacitor device, in particular for a DRAM or the like.

One principal aspect of the ongoing development of modern semiconductor circuit configurations and in particular semiconductor memory technologies is that of increasing the integration density. In this context, the endeavor is to increase the number of switching elements or memory cells which can be formed per unit area in a semiconductor substrate or the like, in order to be able to achieve circuits, in particular semiconductor memories, which are as small, compact and powerful as possible.

Many semiconductor circuit configurations require capacitor configurations, for example including in the form of storage capacitors or the like. These capacitor configurations are often formed as so-called trench capacitors or trench-structure capacitors or they are in the form of stacked capacitors. In dynamic read/write memories, for example of the DRAM type, capacitor configurations of this type are used, for example in single-transistor cells, as memory elements. A select transistor thereby connects the storage capacitor to a bit line.

The structural design and the fabrication of capacitor structures or capacitor configurations are, in very general terms, problematical and of interest if the integration density is to be increased. In the above text and in the text which follows, the term capacitor structure or capacitor configuration is to be understood in very general terms as an arrangement comprising a first material region, which serves as an electrode region, substantially directly spatially adjacent to a second material region, which serves as a dielectric region, and a counterelectrode which adjoins the dielectric region.

On account of the requirements with regard to the increased integration of known semiconductor memory devices, it is also necessary for the corresponding capacitor devices to be further miniaturized. However, for capacitor devices of this type to operate reliably, it is imperative that a certain minimum capacitance be provided. However, since the capacitance of the capacitor—in particular with parameters which are otherwise constant—is closely correlated to the surface dimensions of the capacitor device, accordingly a minimum size, i.e. a minimum extent of the opposite electrode regions with the dielectric region between them, is necessary in order to achieve a minimum capacitance. However, maintaining a minimum size runs decisively counter to the desire to further increase the integration density of semiconductor memory devices.

SUMMARY OF THE INVENTION

It is accordingly an object of the invention to provide a method of fabricating a trench structure capacitor configuration which overcomes the above-mentioned disadvantages of the heretofore-known devices and methods of this general type and which makes it easy to ensure a suitable minimum capacitance even when the dimensions are reduced further.

With the foregoing and other objects in view there is provided, in accordance with the invention, a method of fabricating a trench-structure capacitor device, which comprises:

forming a trench structure with at least one trench in a semiconductor substrate, the trench having a base region, lower wall regions, and upper wall regions;

forming a configuration including a first electrode region, a second electrode region, and a dielectric region therebetween in the trench, wherein at least the lower wall regions and the base region of the trench are lined with a part of the first electrode region, the second electrode region and the dielectric region;

freeing or leaving clear the upper wall regions of material of the first electrode region, of the dielectric region and of the second electrode region, such that a material of the upper wall region of the trench lies exposed;

forming the upper wall region of the trench with an insulation region by selective, thermally induced conversion of the material of the upper wall region;

wherein the first electrode region is formed at least in part from at least one metallic material or metal nitride;

wherein firstly the first electrode region is formed; and the dielectric region is subsequently formed conformally by a process selected from the group consisting of physical, chemical, electrochemical, and oxidative conversion of at least part of the first electrode region.

In other words, the inventive method for fabricating a trench-structure capacitor device or the like, in particular for a semiconductor memory device, a DRAM or the like, a trench structure which has at least one recess or trench is formed in a semiconductor substrate, a passivation region and/or a surface region thereof. Furthermore, an arrangement having a first electrode or a first electrode region, a second electrode or a second electrode region and/or a dielectric region provided substantially therebetween, in particular in this order, in each case in substantially continuous form, is formed at least in the region of the trench, at least lower wall regions or lower edge regions and/or base regions of the trench being, at least in part, substantially covered and/or lined at least with a part of the first electrode region, of the dielectric region and/or of the second electrode region. The arrangement of the electrode regions with the dielectric provided between them then in each case leads to the formation of the corresponding capacitor device.

In the method according to the invention for fabricating a trench-structure capacitor device for a semiconductor circuit configuration and in particular for a semiconductor memory device, a DRAM or the like, it is furthermore provided that at least the second electrode region and, under certain circumstances, the first electrode region are formed at least in part from at least one metallic material, metal nitride and/or the like.

Furthermore, in the method according to the invention for fabricating a trench-structure capacitor device, it is provided that upper edge regions of the trench are formed with an insulation region, for example what is known as a collar region or an insulating collar. A further inventive measure consists in the upper edge regions of the trench being freed of the material of the first electrode region, the dielectric region and/or the second electrode region or being left clear. This is achieved by the material of the upper edge region or wall region of the trench itself being uncovered. According to the invention, this uncovered region of the material of the upper edge region or wall region of the trench is converted into an insulation region by selective, thermally induced conversion of the material of the upper edge regional wall region which is present there, in particular by an oxidation process or the like. In this context, the term "selective" is to be understood as meaning a treatment in an $H_2$-rich environment.

Therefore, a basic idea of the present invention is, during the formation of the trench-structure capacitor device, on the one hand to provide a sufficient capacitance of the capacitor by means of the choice of materials used for the respective electrode regions and/or for the dielectric region and the patterning thereof, even at high integration densities, i.e. a reduced size or dimension of the capacitor surface area, and, on the other hand, to form the required insulation region or collar region in the upper wall region or edge region of the trench in a particularly simple manner, by means of a corresponding procedure, such that additional alignment and orientation of the collar region with respect to the arrangement in the trench and in particular with respect to the arrangement comprising first electrode region, second electrode region and dielectric region arranged therebetween can be dispensed with. According to the invention, this is achieved precisely by the fact that the upper wall regions or edge regions of the trench, in which the collar region is to be formed, is freed of the material of the arrangement comprising first electrode region, dielectric region and second electrode region or is left clear, so that subsequently the basic material of the upper edge region or wall region of the trench, i.e. in particular a semiconductor material, preferably a silicon material in single crystal form, can be selectively converted into an insulation region or collar region by means of an oxidation process.

Furthermore, it is provided that the dielectric region is formed at least in part from a material with a dielectric constant which is increased, in particular compared to $SiO_2$, $Si_3N_4$ and/or the like.

In a particularly advantageous embodiment of the method according to the invention, the first electrode region, the dielectric region and/or the second electrode region are in each case formed in layer-like, in particular in each case multilayered, form.

The multilayered form is important in particular for the formation of the first electrode region.

Firstly, it is provided that, according to a particularly preferred embodiment of the method according to the invention, a doped region or doping region, in particular in $n^+$-doped form in single-crystal silicon and/or the like, is formed as first electrode region or as part thereof in the lower wall region or edge region and/or in the base region of the trench.

This is preferably achieved by the fact that a material region as dopant deposit, in particular comprising arsenic silicate glass or the like, is deposited locally in the lower wall region or edge region and/or in the base region of the trench.

Furthermore, it is preferred for the dopant to be introduced into the lower wall region or edge region and/or the base region of the trench by thermally induced diffusion, in particular of the arsenic. This preferably leads to the formation of a buried plate structure, which can then be used as first electrode region or as part thereof.

After the dopant has diffused out of the dopant deposit, the material of the dopant deposit is specifically removed from the trench. It is particularly advantageous if, according to a particularly preferred embodiment of the fabrication method according to the invention, a material layer or a material region, in particular comprising a metallic material, a metal nitride and/or the like, is formed as second part of the first electrode region on the doped region or the doping region as first part of the first electrode region.

In a further advantageous embodiment of the fabrication method according to the invention, the first electrode region, the dielectric region and/or the second electrode region are in each case formed substantially conformally. The result of this is that should certain annealing steps or further processing steps be required for the individual layers, the basic structure of the semiconductor substrate, of the passivation region or the like are substantially protected. After the corresponding layer structures have been formed and processed further, suitable patterning, for example by means of selective etching processes or the like, can then take place.

The formation of the first electrode region, of the dielectric region and/or of the second electrode region preferably in each case take place by means of deposition, in particular by means of a CVD process, by means of an ALD process, by means of an electrochemical conversion and/or deposition process and/or the like.

It is particularly advantageous that, according to a further embodiment of the method according to the invention for fabricating a trench-structure capacitor device, firstly the first electrode region is formed. Then, according to this embodiment, the dielectric region is formed by physical and/or chemical conversion of at least part of the first electrode region. This is achieved in particular by, preferably electrochemical, oxidation or the like and/or in particular conformally. The result of this measure is that both the inventive solutions are incorporated in an integrated process sequence. In this case, first of all the first electrode material, which is to be of metallic form, is deposited, and is then, by way of example, treated electrochemically, with the result that a dielectric region with a dielectric constant which is increased compared to conventional materials is produced.

In a particularly advantageous embodiment of the fabrication method according to the invention, the first electrode region and/or the second electrode region are formed at least in part from Al, Si, W, WN, Ta, TaN, Ti, TiN, Hf, HfN, Zr, ZrN, Mo, MoN, Y, YN, La, LaN, Ce, CeN, TaSiN, WSiN, TiAlN, WSi, MoSi, CoSi and/or the like and/or a combination or compound thereof.

It is also provided that the dielectric region is formed at least in part from $Al_2O_3$, AlN, $TiO_2$, $Ta_2O_5$, $HfO_2$, $ZrO_2$, $WO_3$, $MoO_2$, $Y_2O_3$, $La_2O_3$, $CeO_2$, MgO and/or the like and/or a combination or compound thereof.

These and further aspects of the present invention will be explained in more detail with reference to the following observations.

Nowadays, what are known as 1-transistor cells are used in dynamic random access memories, known as DRAMs. These cells comprise a storage capacitor and a select transistor, which connects the storage electrode to the bit line. The storage capacitor is often formed as a trench capacitor, i.e. a hole is etched into the substrate and a dielectric and a storage electrode are introduced; in the prior art, what is known as doped polysilicon is used. Currently, the doped silicon substrate, known as the buried plate, is used as counterelectrode.

The invention described here relates in particular to this type of memory, in which trench storage capacitors or what are known as trench-structure capacitor devices are used.

To further increase the storage density for future technology generations, the feature size is being reduced from generation to generation. The constantly decreasing size of the capacitor surface areas and the resulting decrease in the capacitance of the capacitors leads to problems with regard to operational reliability. Therefore, an important objective is to keep the capacitance of the capacitor at least constant despite the decreasing feature size. This can be achieved, inter alia, by increasing the surface charge density of the storage capacitor. A further possibility for increasing the capacitance of the capacitor consists in substituting metallic layers, which do not have a space charge region typical of silicon, for the silicon layers which adjoin the dielectric.

Previous attempted solutions with regard to the problems referred to above are based on increasing the size of the capacitor area available for a predetermined feature size. This can be achieved, for example, by widening the trench, for example using the wet bottle principle below the collar region or oxide collar or by depositing polysilicon with a rough surface, for example using the HSG process, in the trench.

On the other hand, hitherto the surface charge density has conventionally been increased by reducing the thickness of the dielectric. Hitherto, exclusively various combinations of silicon dioxide $SiO_2$ and silicon nitride $Si_3N_4$ in combination with doped silicon electrodes have been used as dielectric material for trench capacitors or trench-structure capacitor devices. A further reduction in the thickness of these dielectrics is not possible on account of the high leakage currents which occur as a result.

The present invention also allows the surface charge density to be increased by using new dielectrics in the trench capacitor, with a dielectric constant which is higher than that of dielectrics which have been used hitherto, without significantly increasing the leakage currents. The procedures which have been proposed in the context of the present invention are distinguished in particular by the fact that first of all a metallic film or a combination of metallic films or metal nitrides is deposited, in order to form a first or lower electrode region. These deposited layers can then be oxidized, for example by means of an electrochemical process. The deposition of the metallic films can be effected by CVD, i.e. chemical vapor deposition, by means of ALD, i.e. atomic layer deposition, by means of electrochemical deposition and/or the like.

Suitable materials for the electrode layers are Al, Si, TaSiN, WSiN, TiAlN, WSi, MoSi, CoSi, W, WN, Ta, TaN, Ti, TiN, Hf, HfN, Zr, ZrN, Mo, MoN, Y, YN, La, LaN, Ce, CeN, TaSiN, WSiN, TiAlN, WSi, MoSi, CoSi or similar materials.

Suitable materials for the dielectric layer, in particular formed by electrochemical oxidation of the corresponding metal or metal nitride of the first electrode region, are $Al_2O_3$, AlN, $TiO_2$, $Ta_2O_5$, $HfO_2$, $ZrO_2$, $WO_3$, $MoO_2$, $Y_2O_3$, $La_2O_3$, $CeO_2$, MgO or similar materials.

The silicon electrodes which are conventionally used have the further drawback of forming a space charge region, which represents a parasitic capacitance and therefore further reduces the surface charge density of the storage capacitor.

According to the invention, the surface charge density in the trench can be increased by using metal electrodes. The use of metal electrodes makes it possible to eliminate the parasitic capacitance of the space charge region which occurs in the case of the silicon electrodes which have been used hitherto.

In particular, these metal electrodes can be combined with new dielectrics (e.g. $Al_2O_3$, $ZrO_2$, $HfO_2$, $TiO_2$, $Ta_2O_5$, ... ) in the trench capacitor with higher dielectric constants than dielectrics which have been used hitherto. Furthermore, by using metal electrodes it is possible to reduce the electrode resistance and therefore to shorten the read time of the charge stored in the capacitor.

A further advantage is the reduction in the leakage currents on account of the higher work function of metal electrodes compared to silicon.

Both new dielectrics and metal electrodes can be deposited without problems in structures with very high aspect ratios, inter alia using the atomic layer deposition (ALD) process. For this reason, metal electrodes and new dielectrics can be combined very successfully with processes for increasing the surface area (e.g. wet bottle, HSG).

The invention described here proposes a special method and an integration concept for metal electrodes in the trench, in particular when WN or W is used as metal electrode. The proposed method and the integration concept allow the collar or insulation region to be produced in self-aligned fashion with respect to the metal electrode. This is achieved by selective oxidation, in particular by hydrogen-rich wet oxidation, of the Si substrate in the collar region after the patterning of the metal electrode.

The fabrication method for a trench capacitor with high-k dielectric and metal electrodes which is proposed in the context of the present invention comprises the following basic steps:

a) etching a deep trench (DT) in the (crystalline) silicon (depth approx. 1–10 $\mu$m);
b) depositing arsenic glass (ASG) in the DT;
c) filling the DT with resist;
d) etching back the resist (e.g. by isotropic dry-chemical etching);
e) isotropically etching the ASG in the unmasked, resist-free region (e.g. wet);
f) removing the resist (e.g. by plasma-enhanced and/or wet-chemical process);
g) depositing a covering oxide;
h) diffusing out As by means of a conditioning step (forming the buried plate); and
i) removing the oxide and the ASG (e.g. by wet-chemical means).

Then, working on the basis of these fundamental method steps, the procedure may differ depending on the desired structure of the trench capacitor or of the trench-structure capacitor device. The following text describes further method steps k) to v) and k') to t') for forming an MIM structure (metal-insulator-metal structure) and an MIS structure (metal-insulator-semiconductor structure), respectively. The first sequence produces a sequence of metal/insulator/metal for the first electrode, the dielectric and the second electrode. On the other hand, the second procedure forms a sequence comprising semiconductor material/insulator/metal for the first electrode, the dielectric and the second electrode.

Forming the MIM structure:

k) depositing a metal film (in particular WN or W) as electrode (e.g. by means of atomic layer deposition (ALD), atomic layer chemical vapor deposition (ALCVD) or other suitable CVD processes).
l) filling the DT with resist.
m) etching back the resist (e.g. by isotropic dry-chemical etching).
n) isotropically etching the metal electrode in the unmasked, resist-free region (e.g. wet).
o) removing the resist (e.g. by plasma-enhanced and/or wet-chemical process).
p) selective oxidation of the silicon substrate in the region in which the metal electrode has been removed (by means of hydrogen-rich wet oxidation).
q) depositing a high-k dielectric (e.g. by means of atomic layer deposition (ALD), atomic layer chemical vapor deposition (ALCVD) or other suitable CVD processes).

r) depositing a metal film as electrode (e.g. by means of atomic layer deposition (ALD), atomic layer chemical deposition (ALCVD) or other suitable CVD processes).

s) depositing doped polysilicon (or polysilicon-germanium).

t) etching back the polysilicon (or poly-SiGe).

u) isotropically etching the metal electrode film and the high-k dielectric in the uncovered region (e.g. by wet-chemical or dry-chemical means).

v) removing the oxide (e.g. by wet-chemical means).

Once again proceeding from the basic steps a) to i) of the method according to the invention for fabricating a trench-structure capacitor device, an MIS structure is then produced using the following steps:

k') depositing a high-k dielectric (e.g. by means of atomic layer deposition (ALD), atomic layer chemical vapor deposition (ALCVD) or other suitable CVD processes).

l') depositing a metal film (in particular WN or W) as electrode (e.g. by means of atomic layer deposition (ALD), atomic layer chemical vapor deposition (ALCVD) or other suitable CVD processes).

m') filling the DT with resist.

n') etching back the resist (e.g. by isotropic dry-chemical etching).

o') isotropically etching the metal electrode and the dielectric in the unmasked, resist-free region (e.g. wet).

p') removing the resist (e.g. by plasma-enhanced and/or wet-chemical process).

q') selectively oxidizing the silicon substrate in the region in which the metal electrode has been removed (by way of hydrogen-rich wet oxidation).

r') depositing doped polysilicon (or polysilicon-germanium).

s') etching back the polysilicon (or poly-SiGe).

t') removing the oxide (e.g. by wet-chemical means).

The method described here can also be applied to further integration concepts for metal electrodes in the trench. In particular, in these methods too it is possible to increase the capacitor surface area by also utilizing the collar region. Furthermore, it is also possible for the method described to be applied to buried collar concepts.

By way of example, the following materials may be considered for use as metal electrodes:

WN, W (there is already a selective oxidation process for these materials), and

TiN, TaN, HfN, ZrN, Ti, Ta, Si, TaSiN, WSiN, TiAlN, WSi, MoSi, CoSi.

The method according to the invention offers the following advantages, inter alia:

The collar is produced in self-aligned fashion with respect to the metal electrode.

The use of a high surface charge density in the trench capacitor, resulting from the use of metal electrodes. Unlike with silicon electrodes, in metal electrodes there is no parasitic capacitance through space charge regions.

Reduction in the resistance of the DT filling on account of the use of an upper metal electrode.

Reduction of the leakage currents through the node dielectric on account of the higher work function of (suitable) metal electrodes compared to doped polysilicon.

Combination of the metal electrodes with new dielectrics with a higher dielectric constant (e.g. $Al_2O_3$, $ZrO_2$, $HfO_2$, $TiO_2$, $Ta_2O_5$, . . . ).

Use of ALD to deposit the dielectrics and metal electrodes in trenches with a high aspect ratio.

Therefore, the basic ideas of the present invention are firstly the use of new dielectrics with relatively high dielectric constants, the use of metallic electrode layers to avoid space charge regions and the self-aligning procedure during the formation of the insulation or collar regions.

If the process sequence allows the use of identical metals for the electrode and for the dielectric—in the latter case as oxide metal—the advantage that the deposition does not have to be perfectly conformal, provided that the electrochemical oxidation takes place conformally, should be emphasized. Nonconformal deposition results in a nonconformal metal electrode, which is considered significantly less critical than a dielectric which has been deposited nonconformally.

The formation of a metallic electrode layer and a dielectric during deposition of a metallic layer is conceivable as one exemplary embodiment. Irrespective of this, the deposition of two or more metallic layers, either to produce mixed dielectrics or to use different metals for the electrodes, is also possible. After a first metallic layer has been deposited in a trench structure for the trench capacitor, partial electrochemical oxidation of this metal layer is carried out. The structure formed in this way can then be filled with another metal or with polysilicon as counterelectrode.

Other features which are considered as characteristic for the invention are set forth in the appended claims.

Although the invention is illustrated and described herein as embodied in a method for fabricating a trench-structure capacitor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
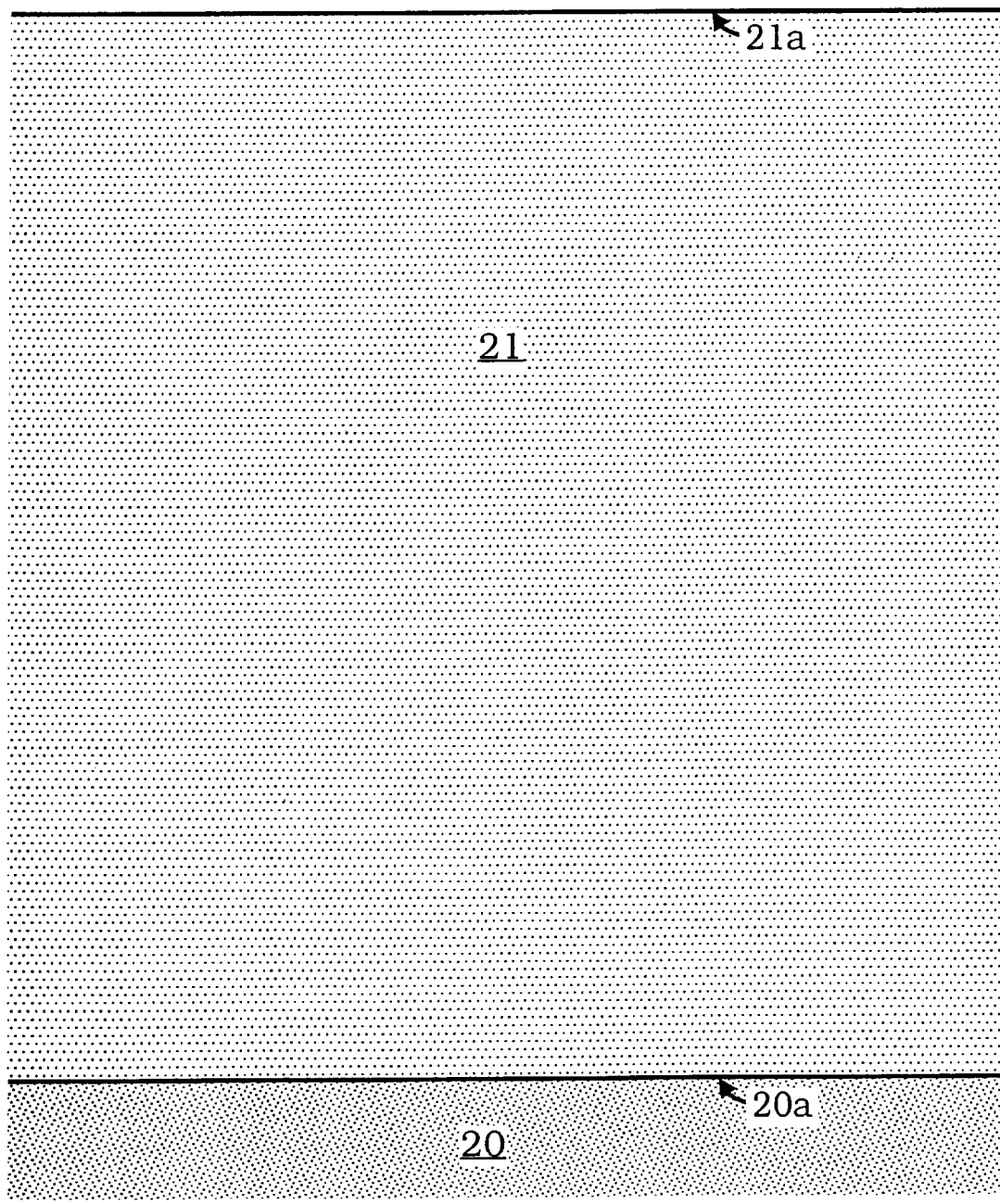
FIGS. 1–10 are diagrammatic cross-sectional side views of sequential intermediate stages that are reached by basic method steps of an embodiment of the method according to the invention.

Referring now to the figures of the drawing in detail the following 22 views show diagrammatic, sectional side views of intermediate stages of examples of the novel fabrication of a trench-structure capacitor device. Throughout the figures, identical reference symbols denote the same elements and structures, which are not described in detail each time they appear.

The starting point of the inventive formation of a trench-structure capacitor device is the basic structure shown in FIG. 1, in which a second region 21, which is formed with a planar surface region 21a, for example an epitaxially deposited layer 21, in this case consisting in particular of silicon in single crystal form, is provided on a first substrate region 20, for example a first actual semiconductor substrate 20, which likewise has a substantially planar surface region 20a. The semiconductor substrate 20 may have a corresponding basic CMOS structure. The substrate regions 20 and 21 may also form a single, continuous substrate region.

Figure 2:
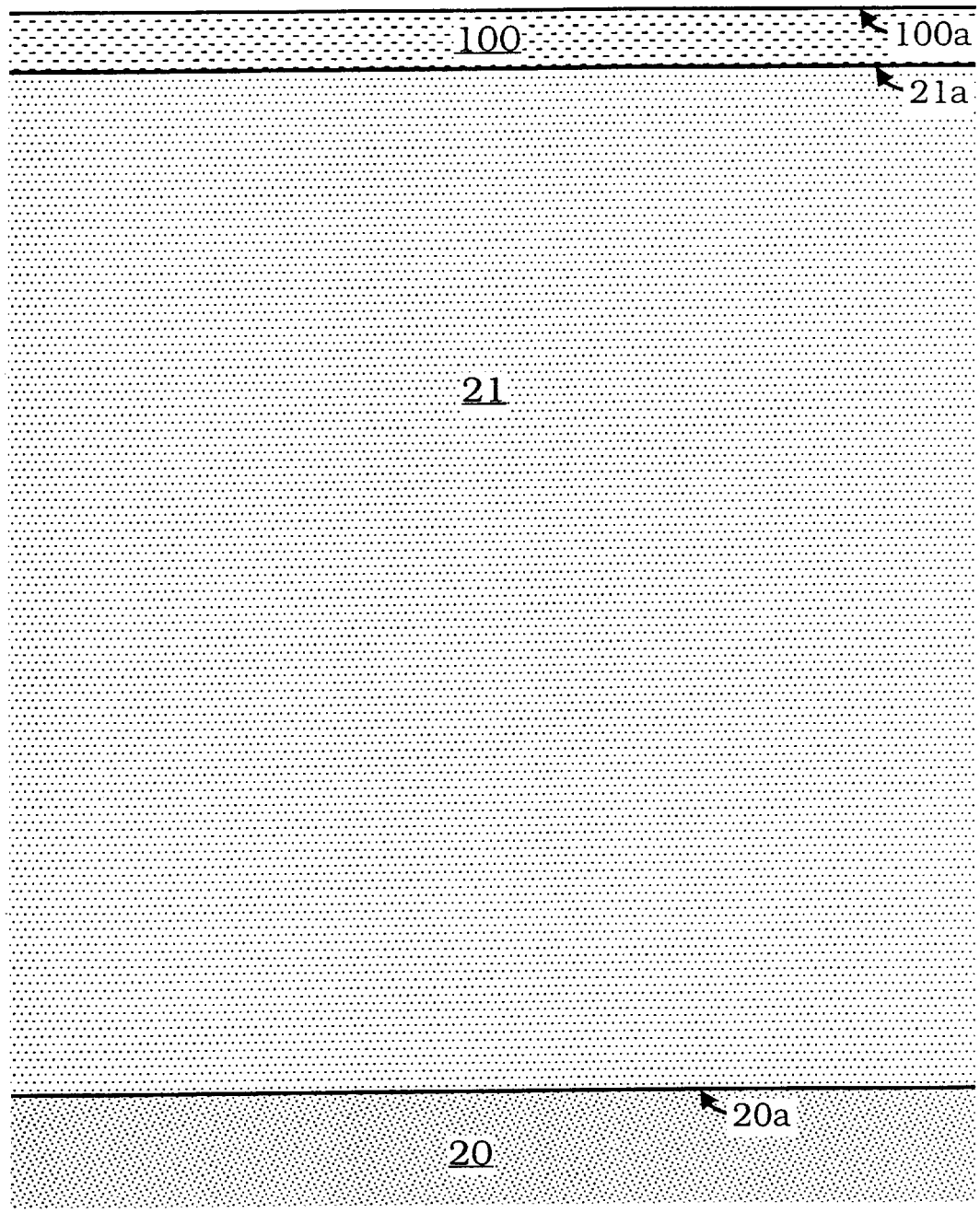
Figure 3:
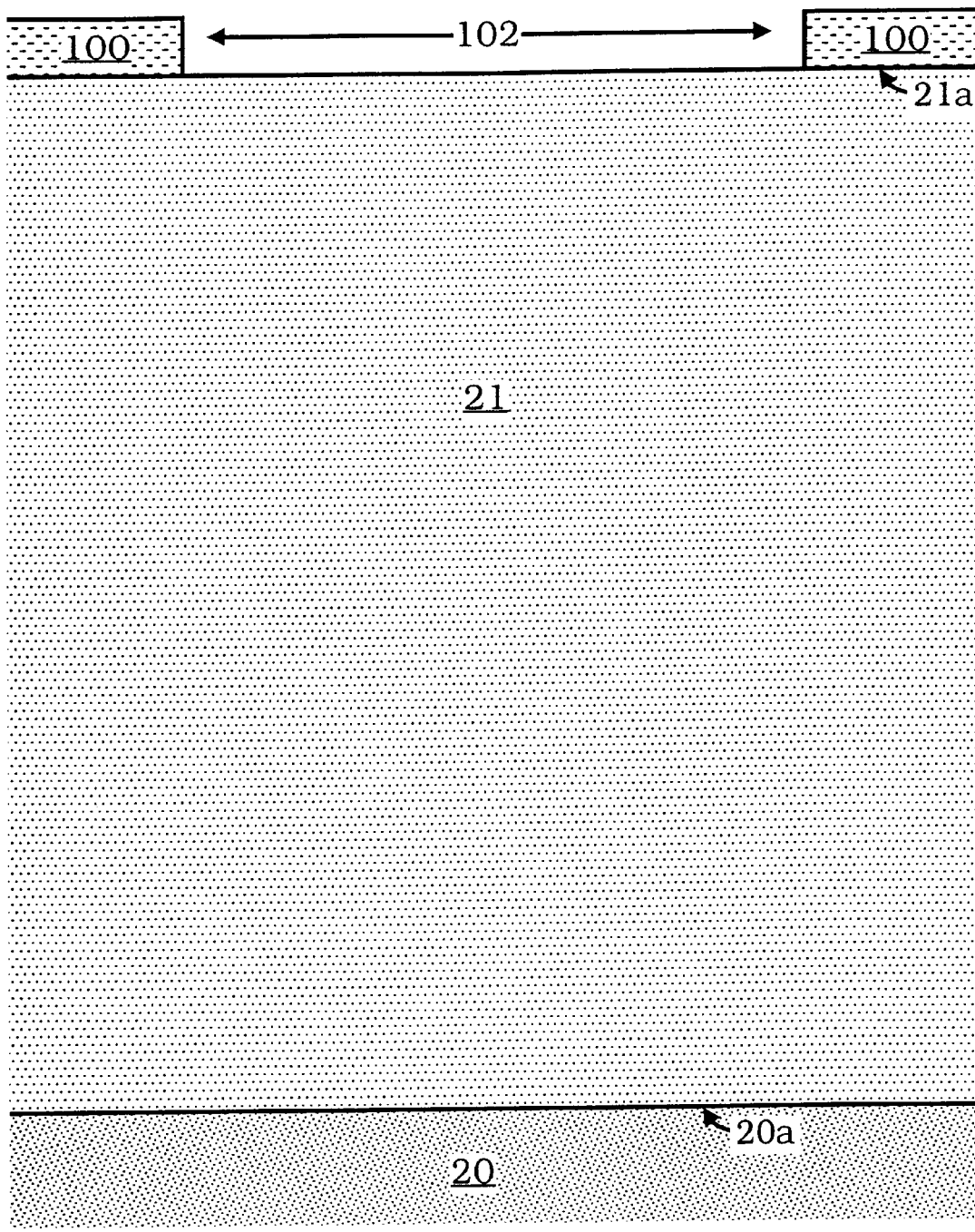
Figure 4:
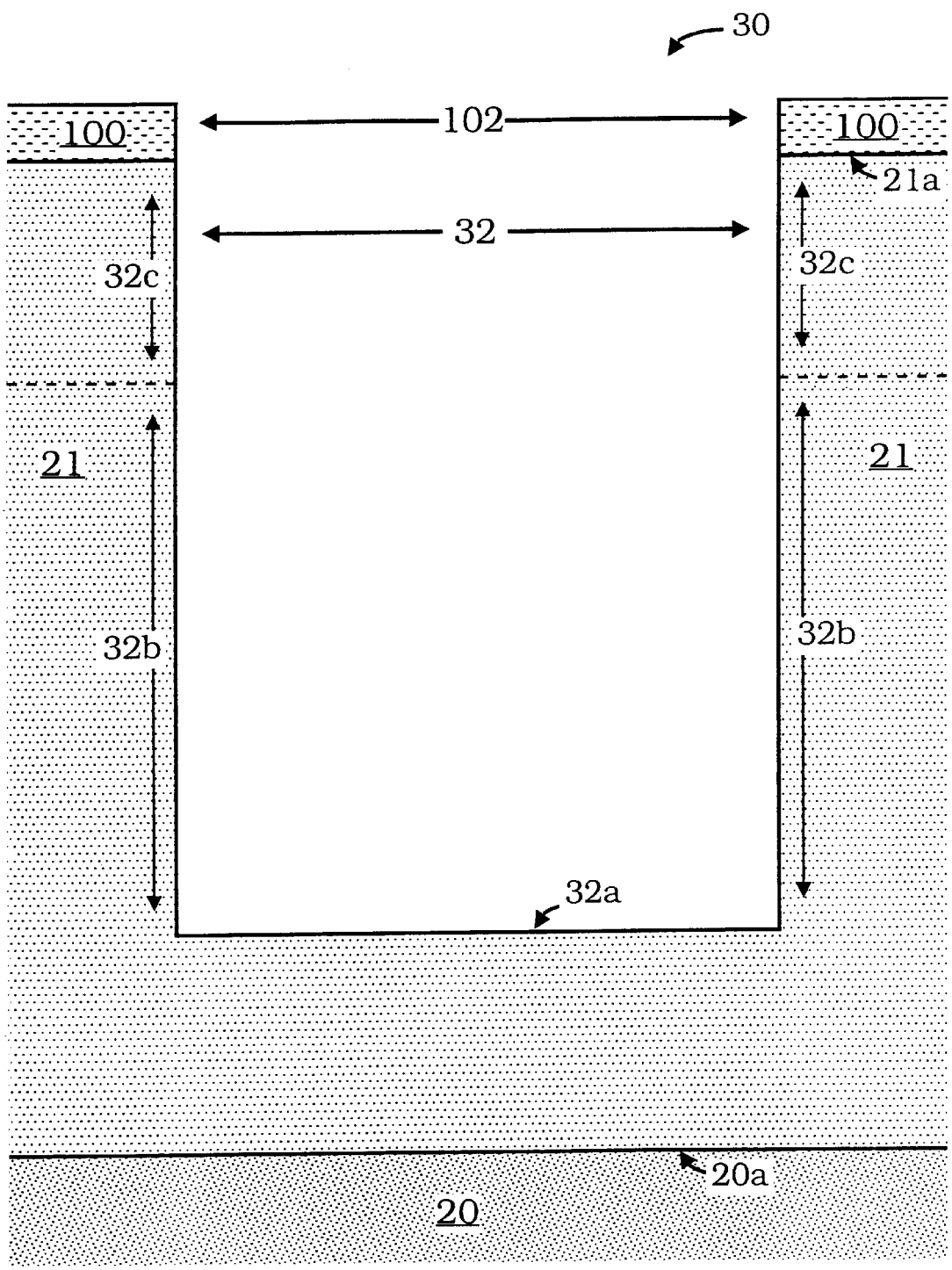

In the transition to the intermediate state shown in FIG. 2, first of all a mask layer 100 with a planar surface 100a is formed on the surface 21a by means of a suitable deposition operation, and then, in the transition to the state shown in FIG. 3, this layer is provided with recesses 102 and is thereby patterned. Therefore, by way of a suitable etching step, a trench structure 30 is formed in the region 21 or its surface region 21a, which in the exemplary embodiment shown in FIG. 4 has one trench 32 with lower wall regions 32b, upper wall regions 32c and a base region 32a.

Figure 5:
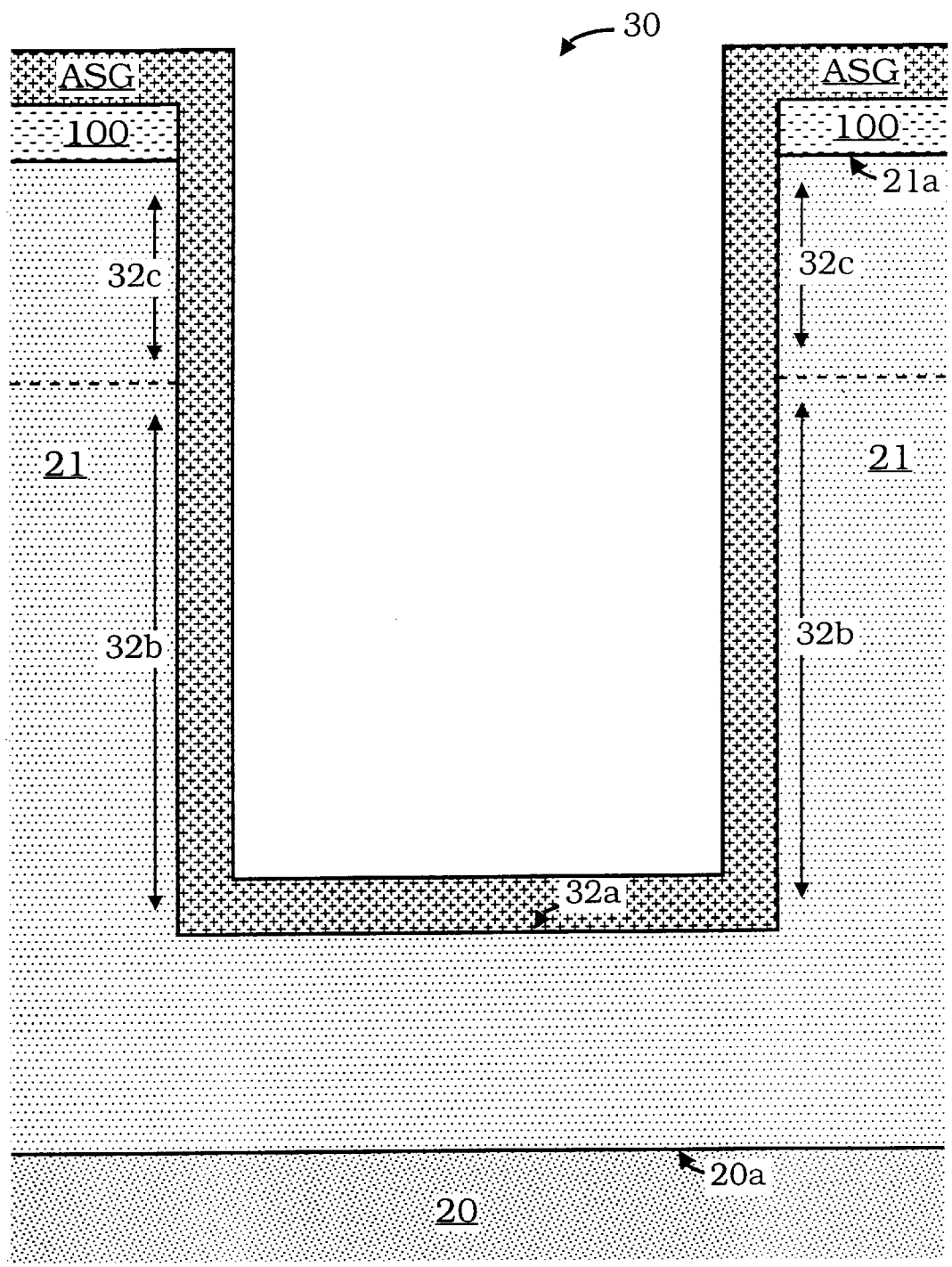

Then, in the transition to the intermediate state shown in FIG. 5, a material region ASG of a dopant, in this case arsenic silicate glass, is formed conformally.

Figure 6:
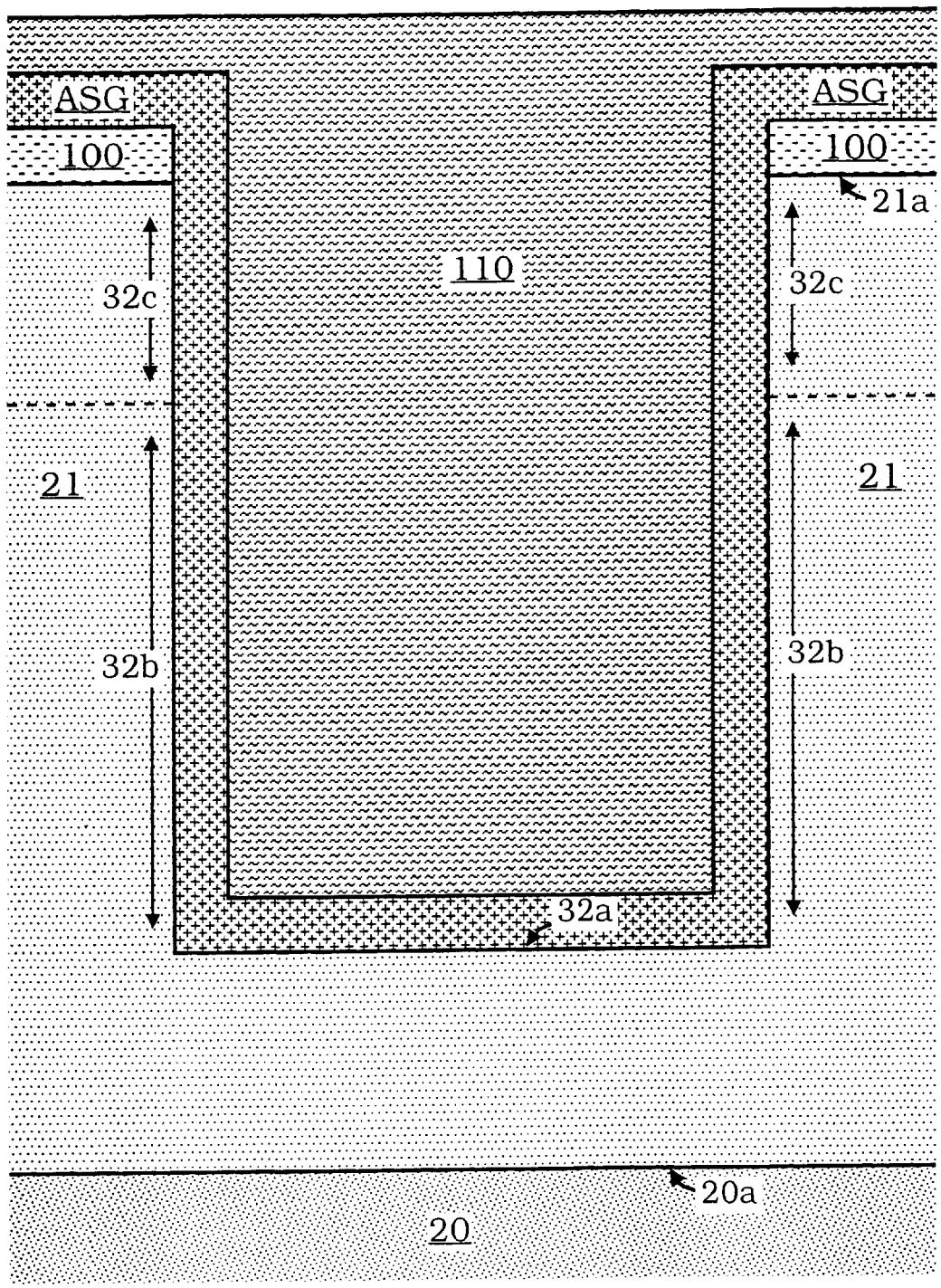

Then, in the transition to the state shown in FIG. 6, a passivation layer 110 is deposited in two dimensions, for example in the form of a resist or the like, specifically in such a manner that the trench 32 of the trench structure 30 is completely filled.

Figure 7:
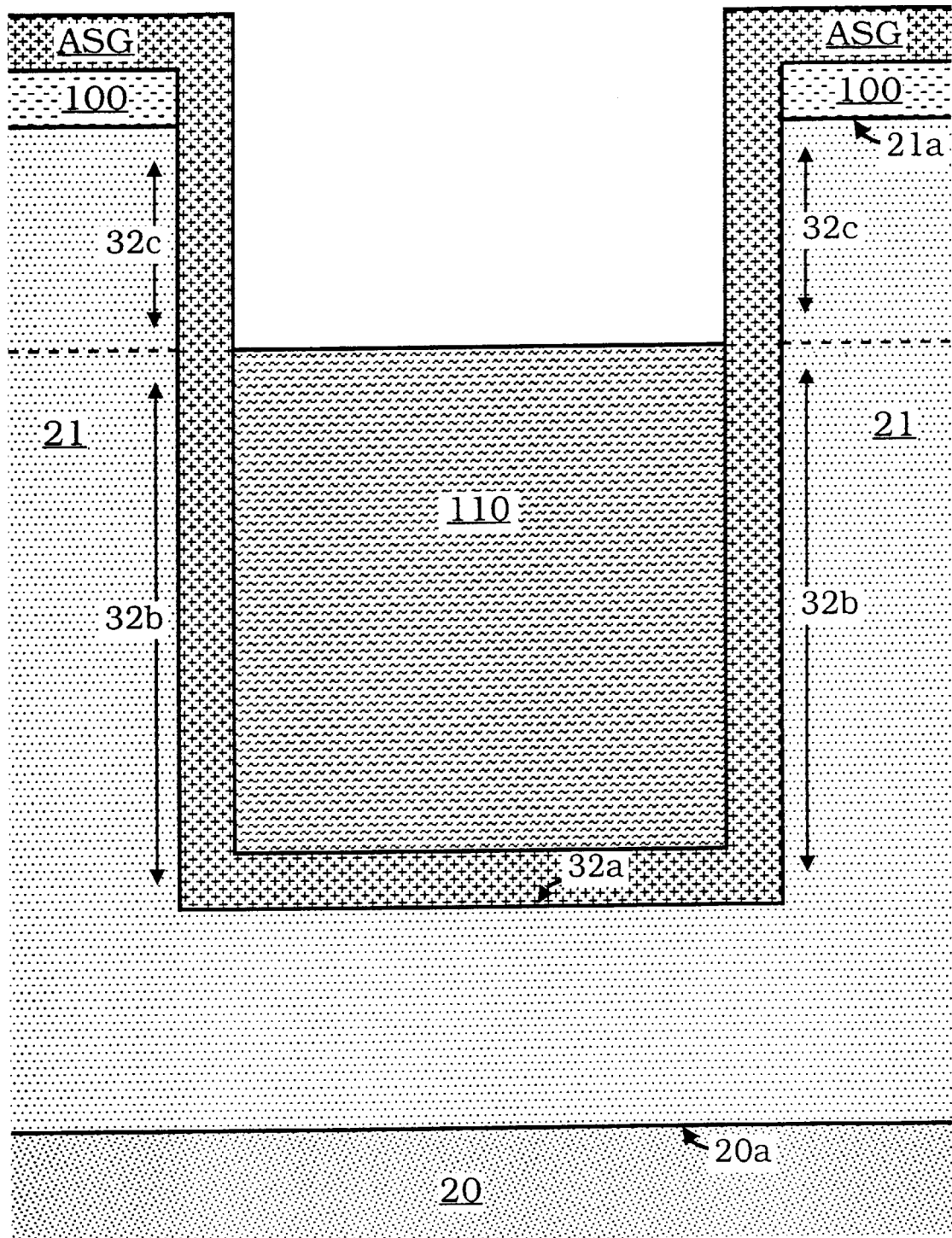

Then, in the transition to the state shown in FIG. 7, the resist is etched back (resist recess), specifically in such a manner that in the trench 32 of the trench structure 30, the resist only remains up to the level of the lower wall regions or edge regions 32b.

Figure 8:
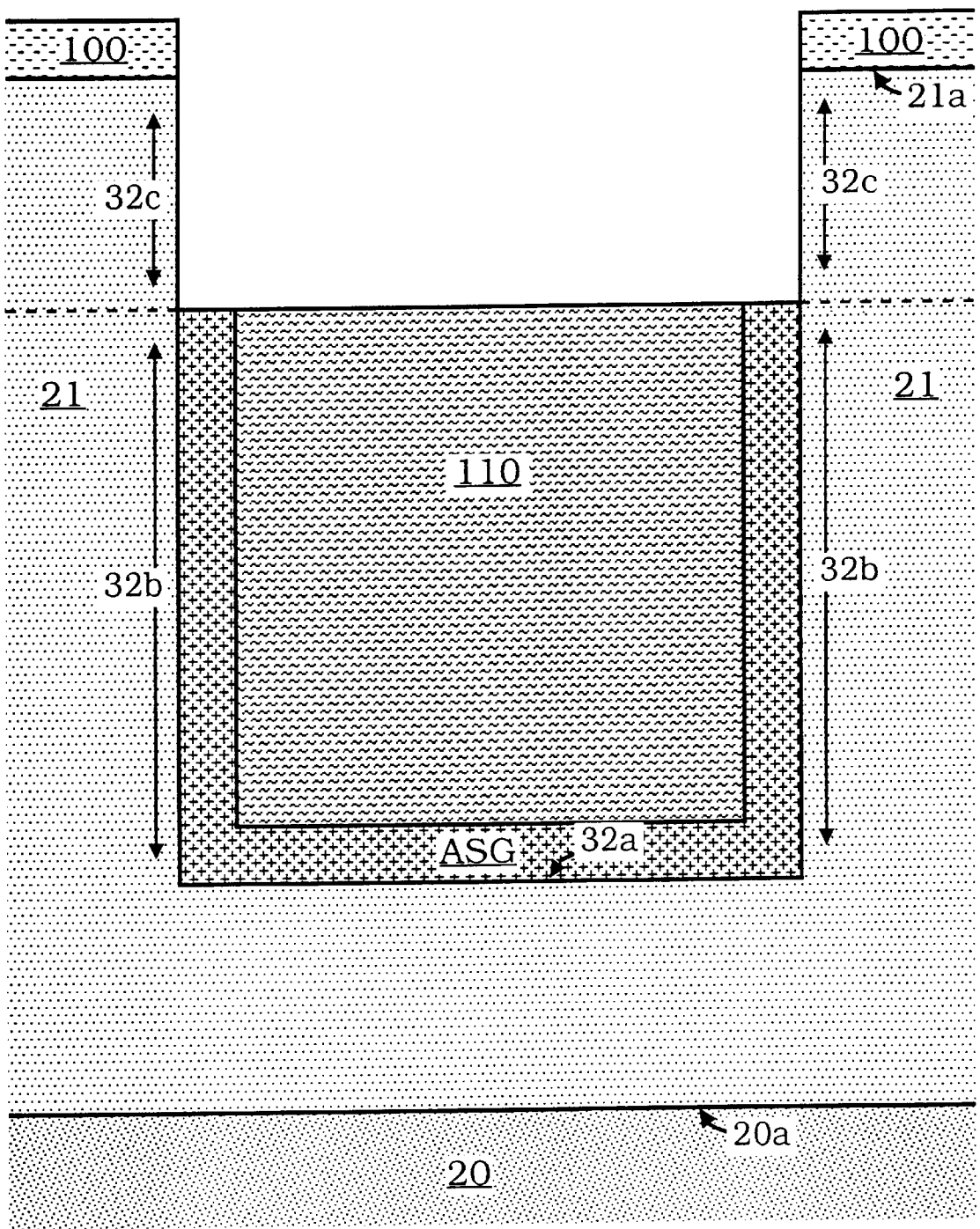

In the next step, during the transition to the arrangement shown in FIG. 8, the remaining resist 110 serves as mask region during-the etching and therefore removal of the dopant layer ASG. As can be seen from FIG. 8, the dopant layer remains exclusively in the region of the lower wall regions 32b and of the base region 32a of the trench 32. The upper wall regions or edge regions 32c are not covered with the dopant layer ASG and are uncovered.

Figure 9:
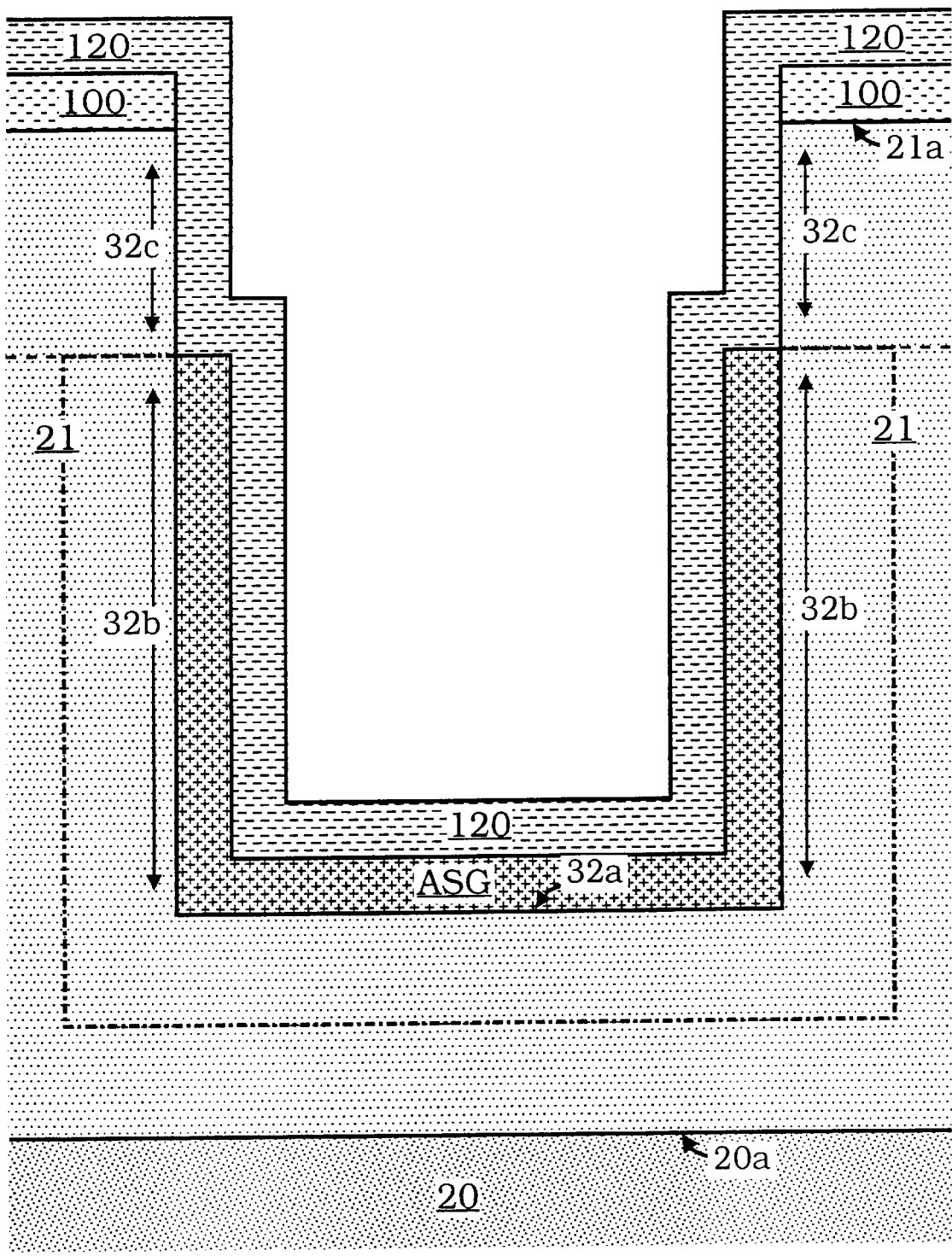

Then, in the transition to the state shown in FIG. 9, first of all the remaining passivation layer 110 or resist layer 110 is removed from the cavity of the trench 32, so that the remaining dopant layer ASG is uncovered. Then, in addition, a further passivation layer 120, in particular in the form of silicon dioxide or the like, is deposited in a conformal and two-dimensional manner. The passivation layer 120 made from silicon dioxide serves as a protective layer during the subsequent formation of the first part 44-1 of the first electrode region 44 in the form of what is known as a doping area 44-1.

Figure 10:
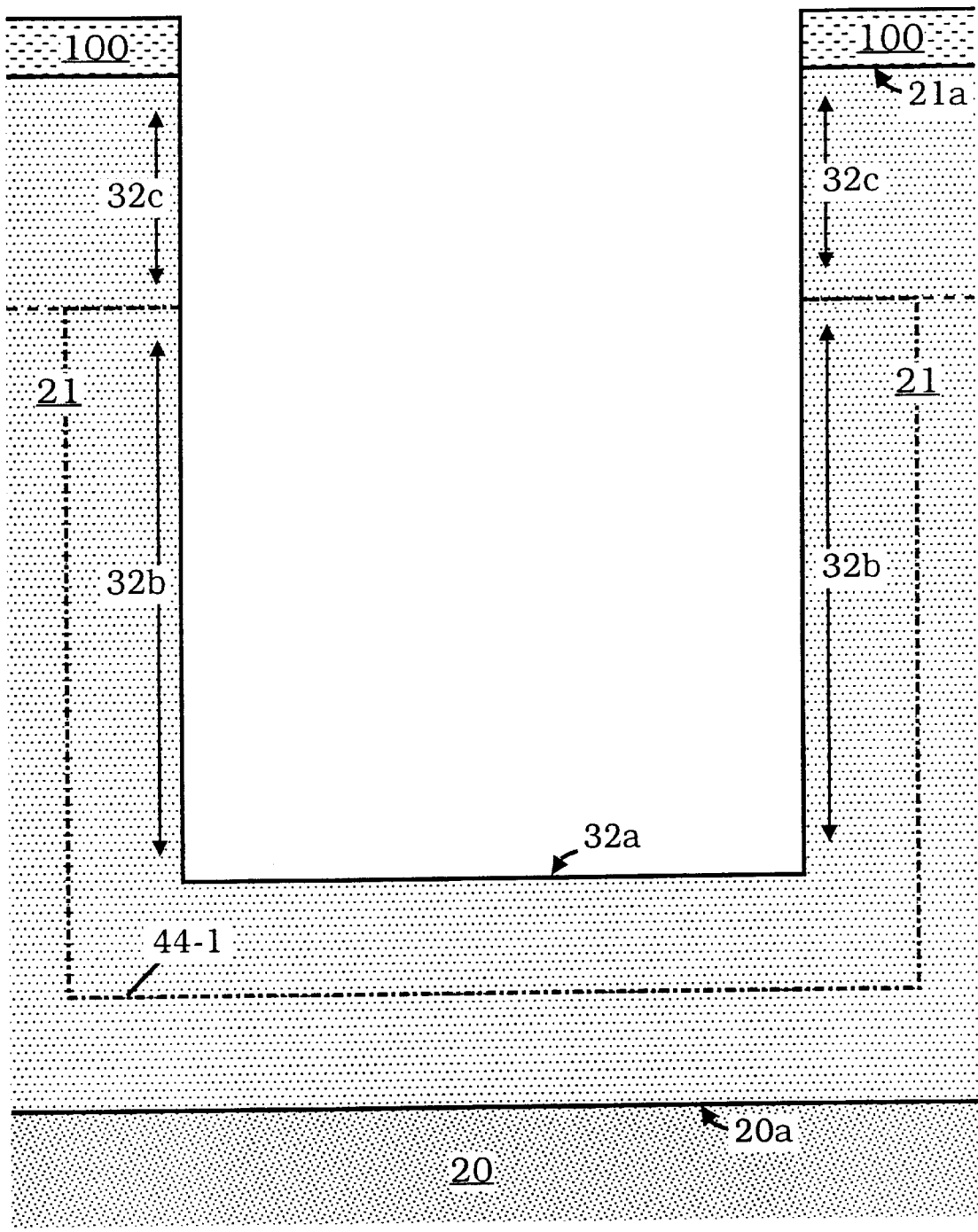

Then, in the transition to the state shown in FIG. 10, the diffusion of the dopant out of the dopant deposit ASG is terminated, the diffusion area 44-1 is thereby completed, and furthermore the passivation layer 120 and the dopant deposit ASG are removed, so that the trench 32 as a whole is uncovered. The diffusion of the dopant out of the dopant deposit ASG forms a so-called buried plate structure.

The configuration shown in FIG. 10 forms the basis for the further method steps. Starting from the above-described configuration, shown in FIG. 10, it is on the one hand possible to form a MIM structure or on the other hand to form an MIS structure, depending on whether the sequence of first electrode region, dielectric region and second electrode region is formed from an arrangement comprising metal/insulator/metal or silicon/insulator/metal.

Processing of a MIM Structure

Figure 11:
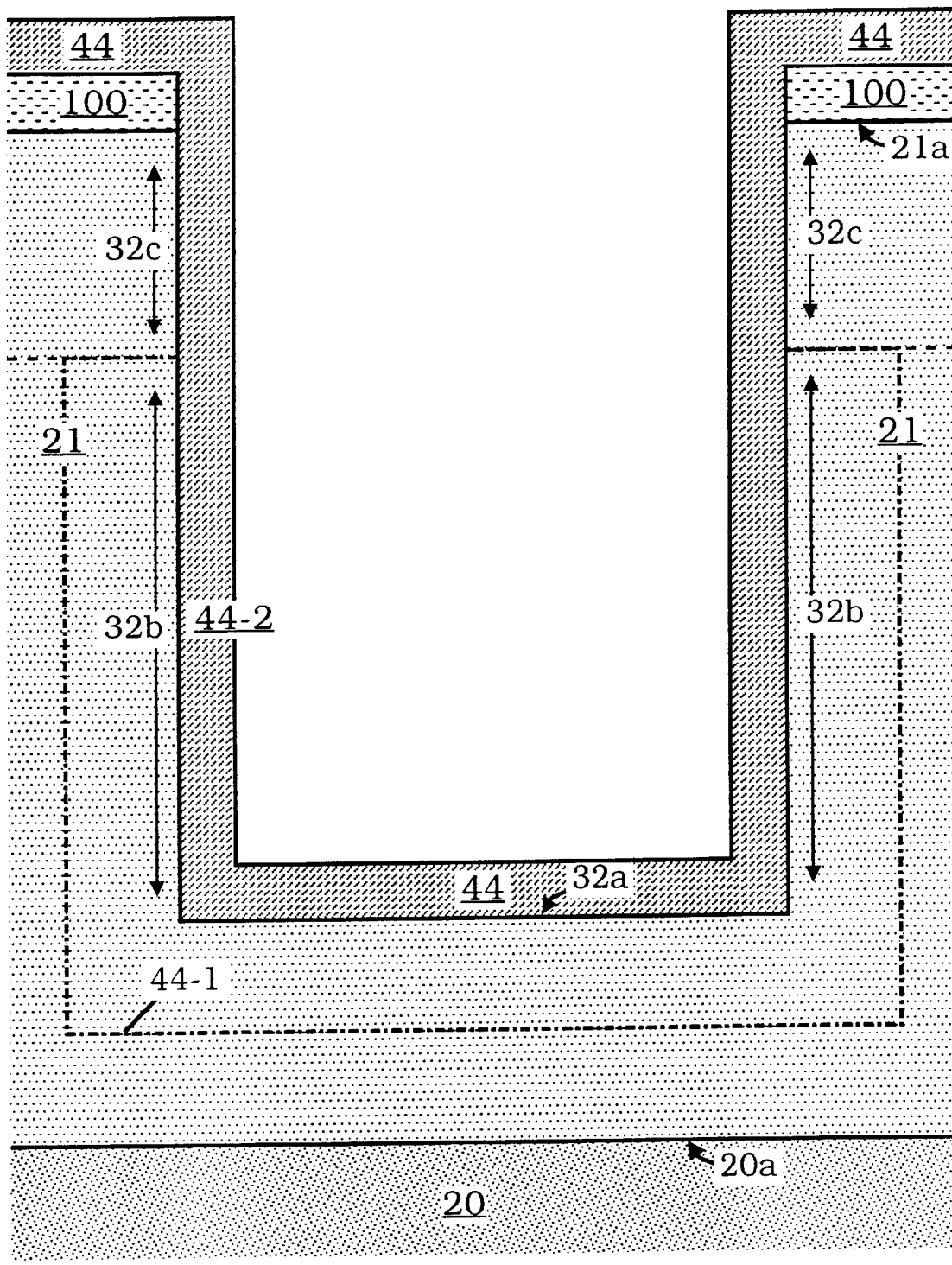
FIGS. 11–17 are diagrammatic cross-sectional side views of sequential intermediate stages in the formation of an MIM structure in accordance with the invention.

Proceeding from FIG. 10, first of all, in the transition to the state shown in FIG. 11 a material region 44-2 as second part 44-2 of the first electrode region 44 is deposited conformally, specifically in the form of a metallic material, a metal nitride or the like.

Figure 12:
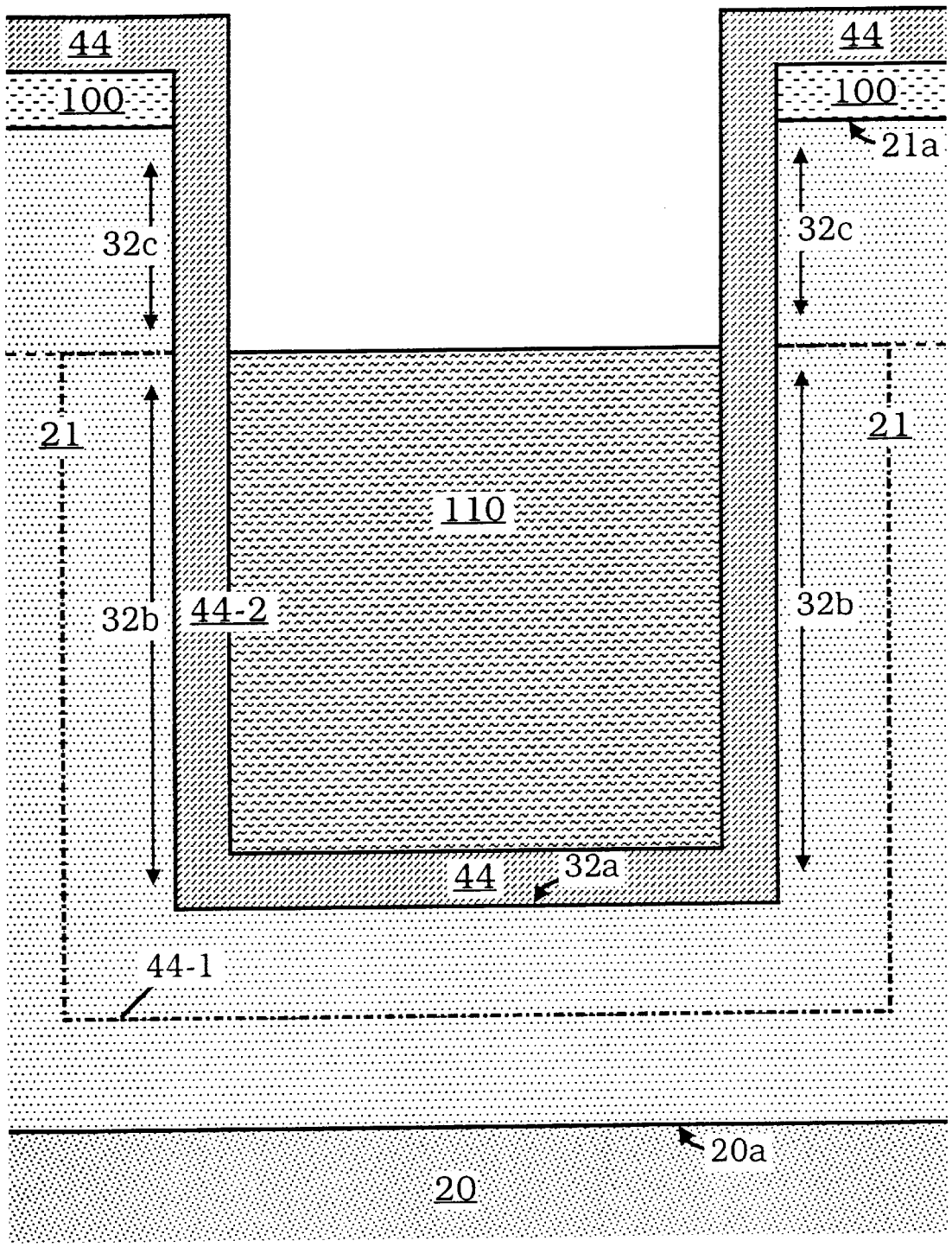

Then, the trench 32 of the trench structure 30 is once again filled with a passivation region 110, in particular a resist layer 110, the resist 110 once again being etched back in order to uncover the upper wall regions or edge regions 32c of the trench 32, as shown in FIG. 12.

Figure 13:
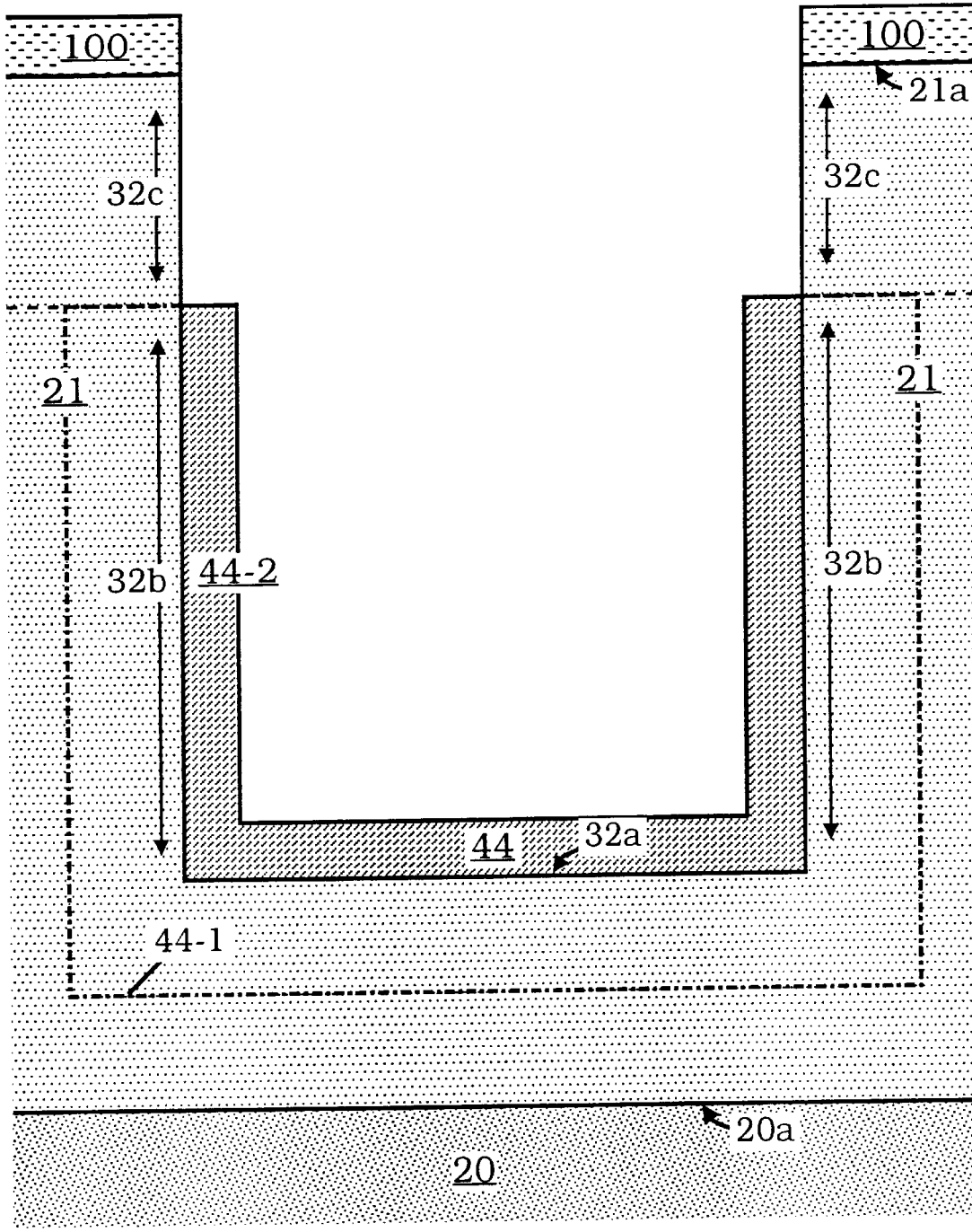

In the transition to the state shown in FIG. 13, the part of the first electrode region 44 which has not been masked with resist and then the resist 110 are removed.

Figure 14:
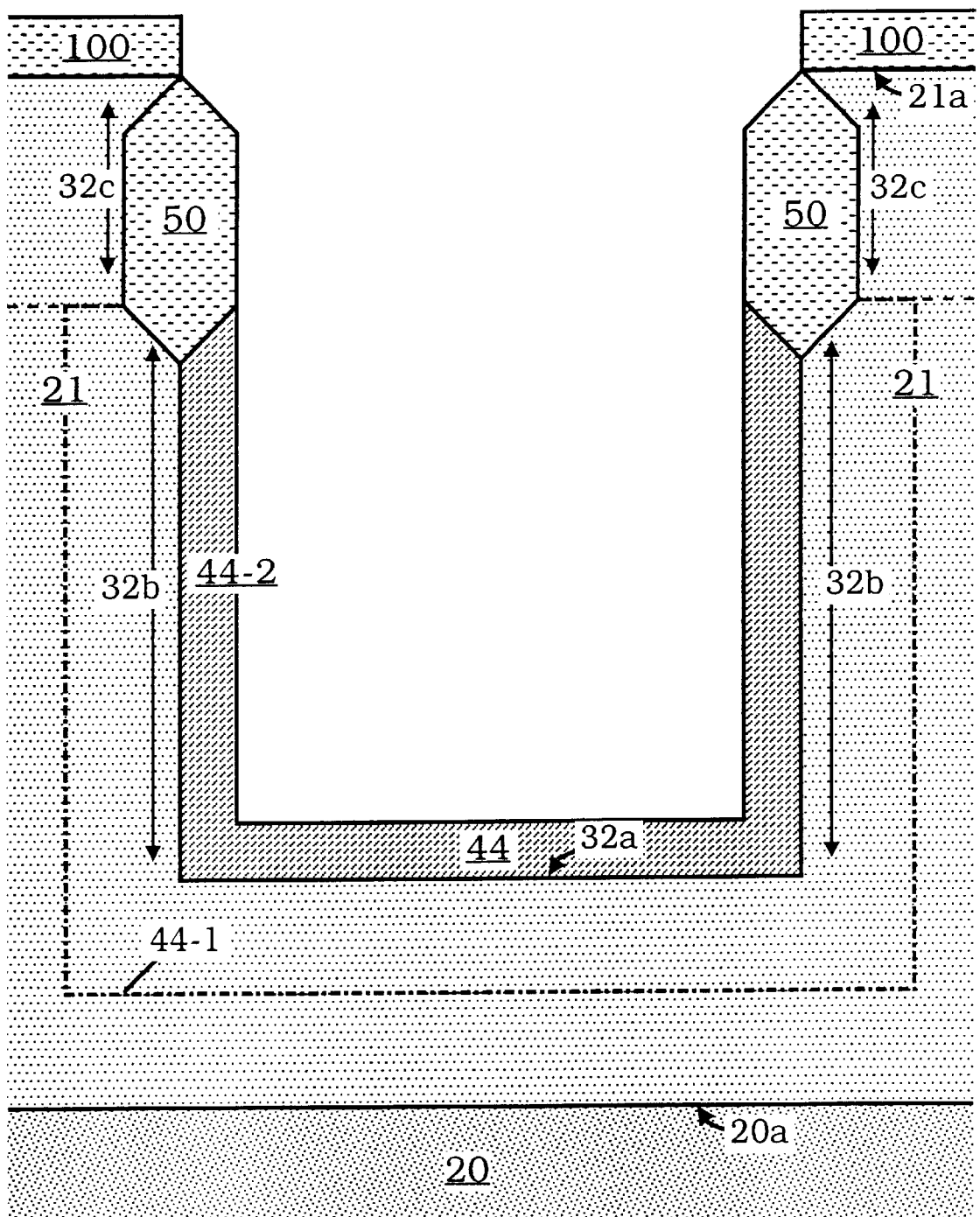

Then, an oxidation step is carried out. The oxidation process, on account of the presence of the metallic second part 44-2 of the first electrode region 44 and of the mask region 100, takes place selectively only at the uncovered material regions, namely the silicon in single-crystal form, the upper wall regions or edge regions 32c of the trench 32. As a result, a corresponding insulation region 50 or collar region 50 is formed locally and selectively there, as shown in FIG. 14.

Figure 15:
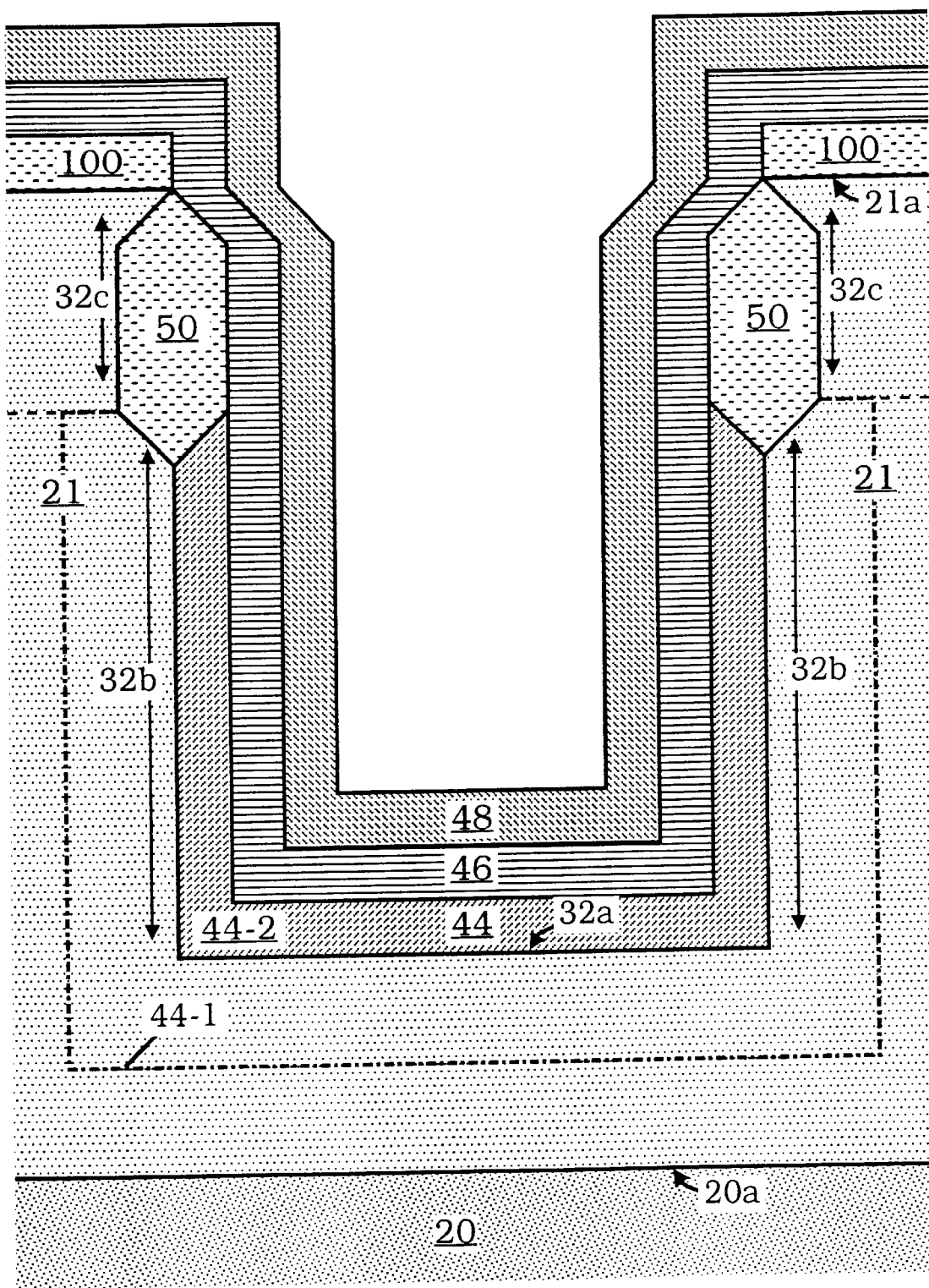

In the transition to the state shown in FIG. 15, the dielectric region 46 comprising a dielectric with a high dielectric constant and the material for the second electrode region 48 are deposited conformally.

Figure 16:
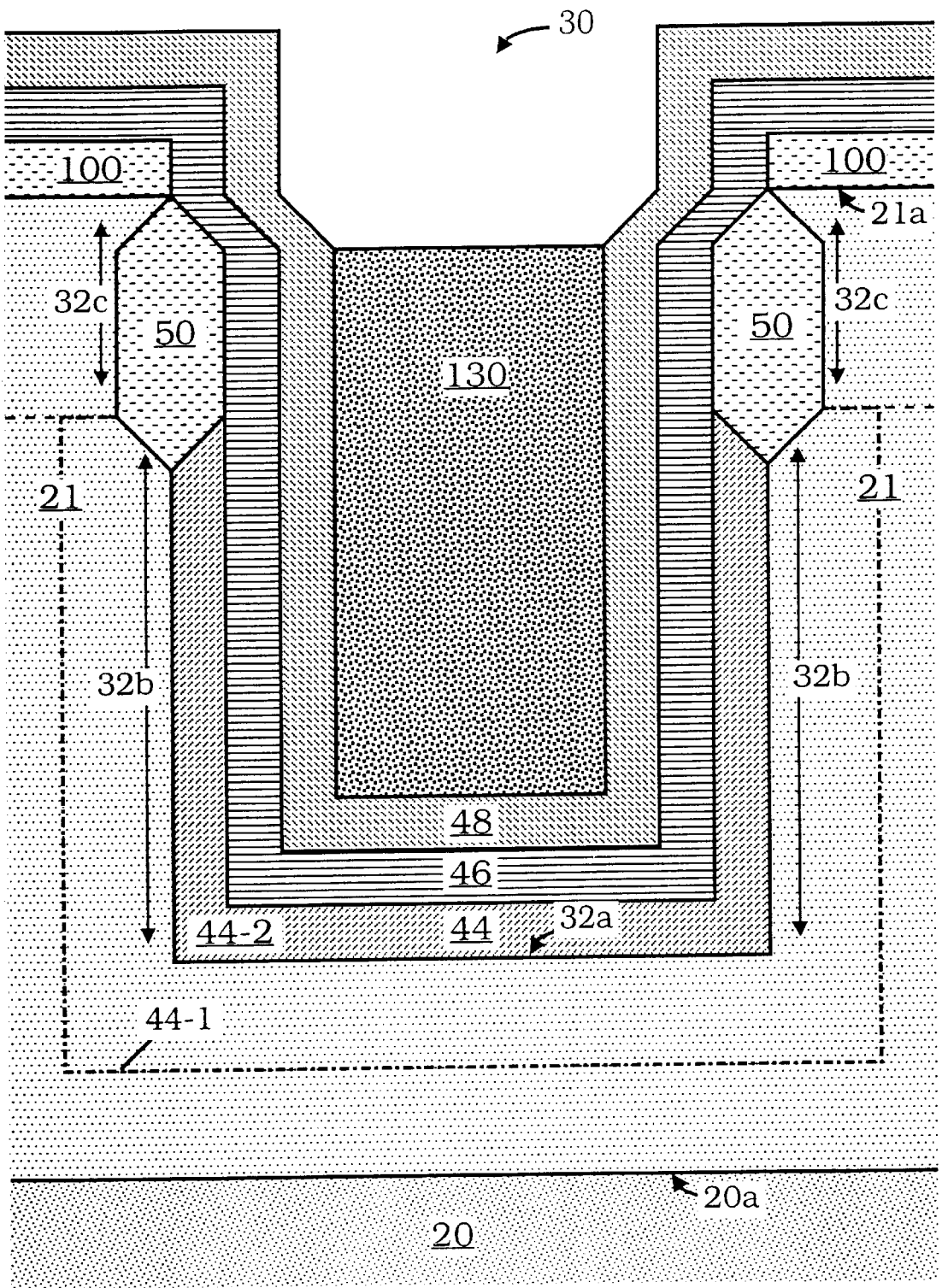
Figure 17:
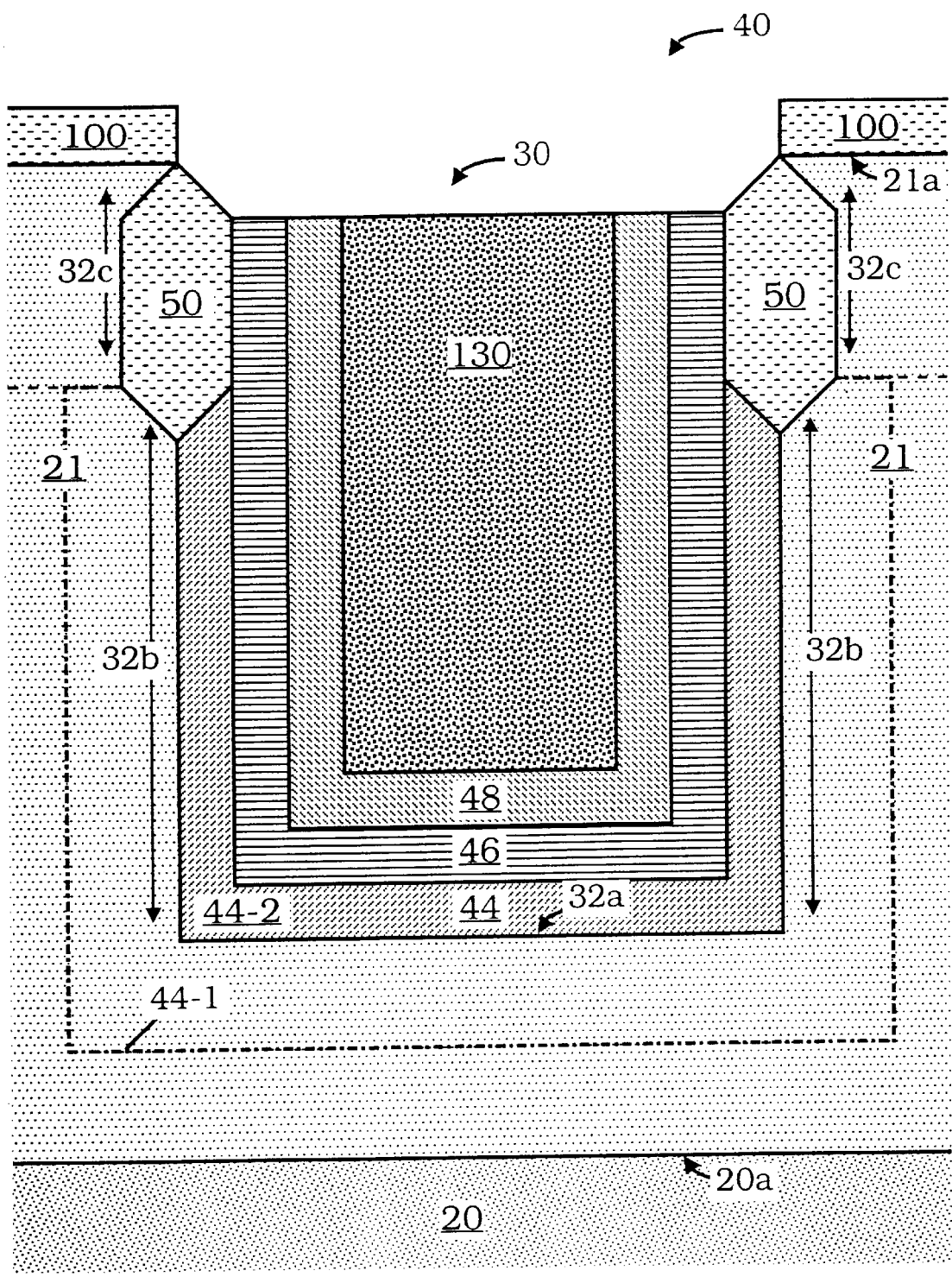

This is followed, in the transition to the state shown in FIG. 16, by filling with doped polysilicon 130 and etching back of this polysilicon filling 130 down to the height of the top edge of the upper edge regions or wall regions 32c of the trench or the corresponding collar region 50, as shown in FIG. 17. The etching-back operation takes place isotropically.

After the mask layer 100 has been removed, further processing can take place in a conventional way.

Processing of an MIS Structure

Once again working on the basis of the configuration shown in FIG. 10, it is possible, as described below, to form an arrangement of semiconductor material, dielectric and metal for the sequence of first electrode region, dielectric region and second electrode region.

Figure 18:
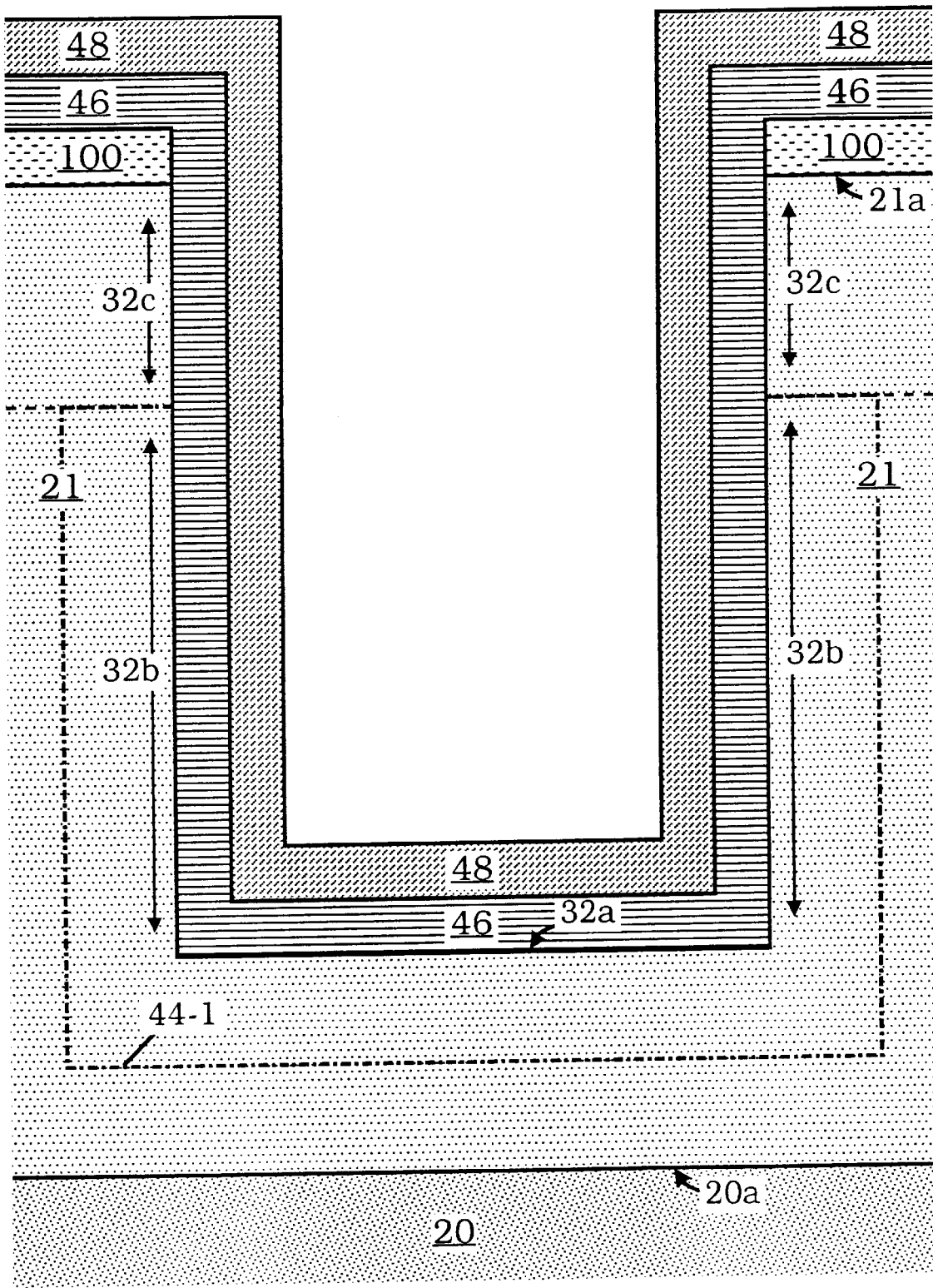
FIGS. 18–22 are diagrammatic cross-sectional side views of sequential intermediate stages in the formation of an MIS structure in accordance with the invention.

For this purpose, in the transition from the arrangement shown in FIG. 10 to the arrangement shown in FIG. 18, the dielectric region 46 and the material region for the second electrode region 48 are deposited conformally after the doping area 44-1, which in this case forms the sole component of the first electrode region 44, has been formed.

Figure 19:
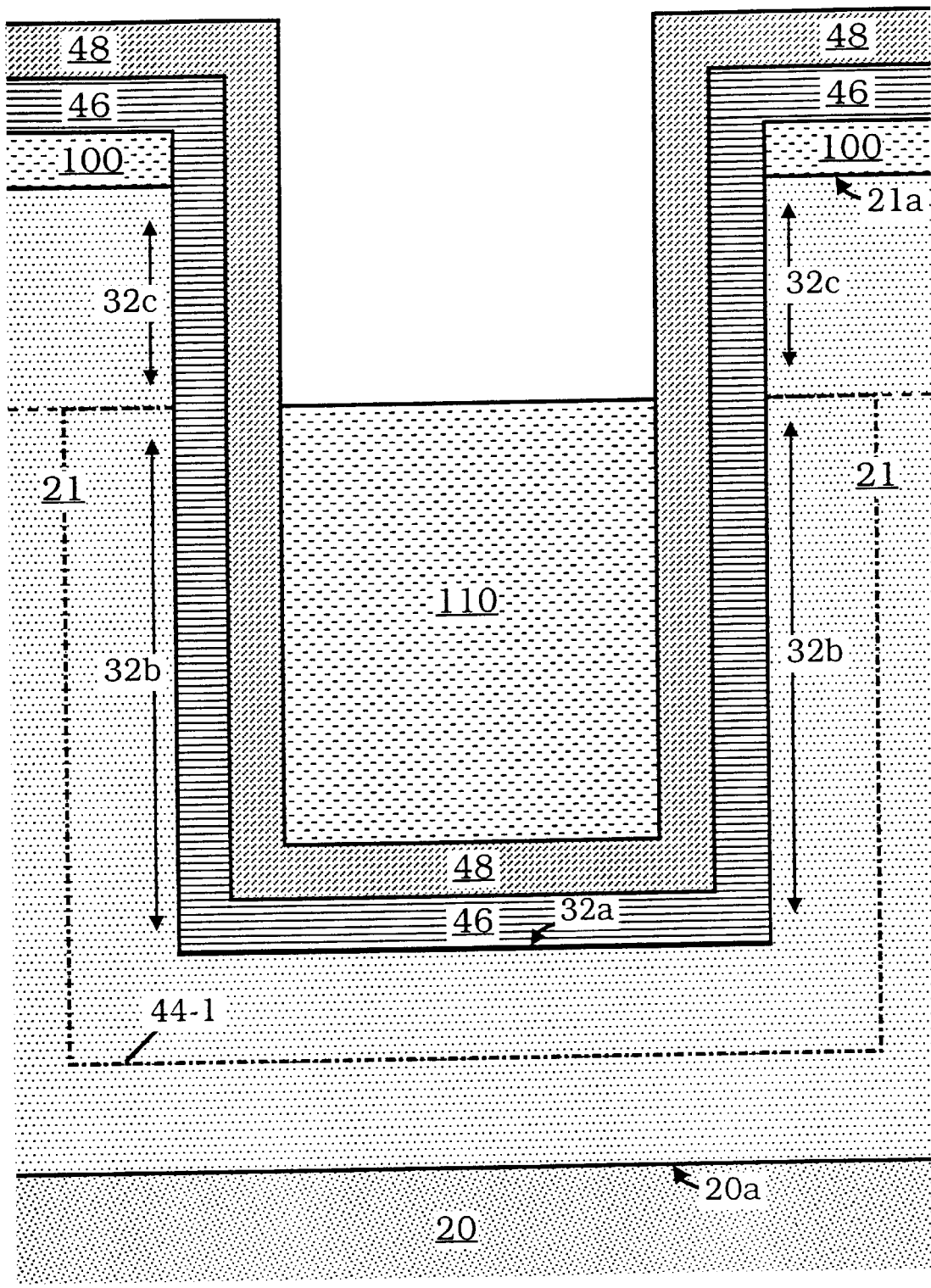

Then, in the transition to the state shown in FIG. 19, corresponding filling of the trench structure 30 having the trench 32 with a passivation region 110 in the form of a resist layer 110 is carried out, with the resist layer once again being etched back down to the top edge of the lower wall regions or edge regions 32b of the trench 32, as shown in FIG. 19.

Figure 20:
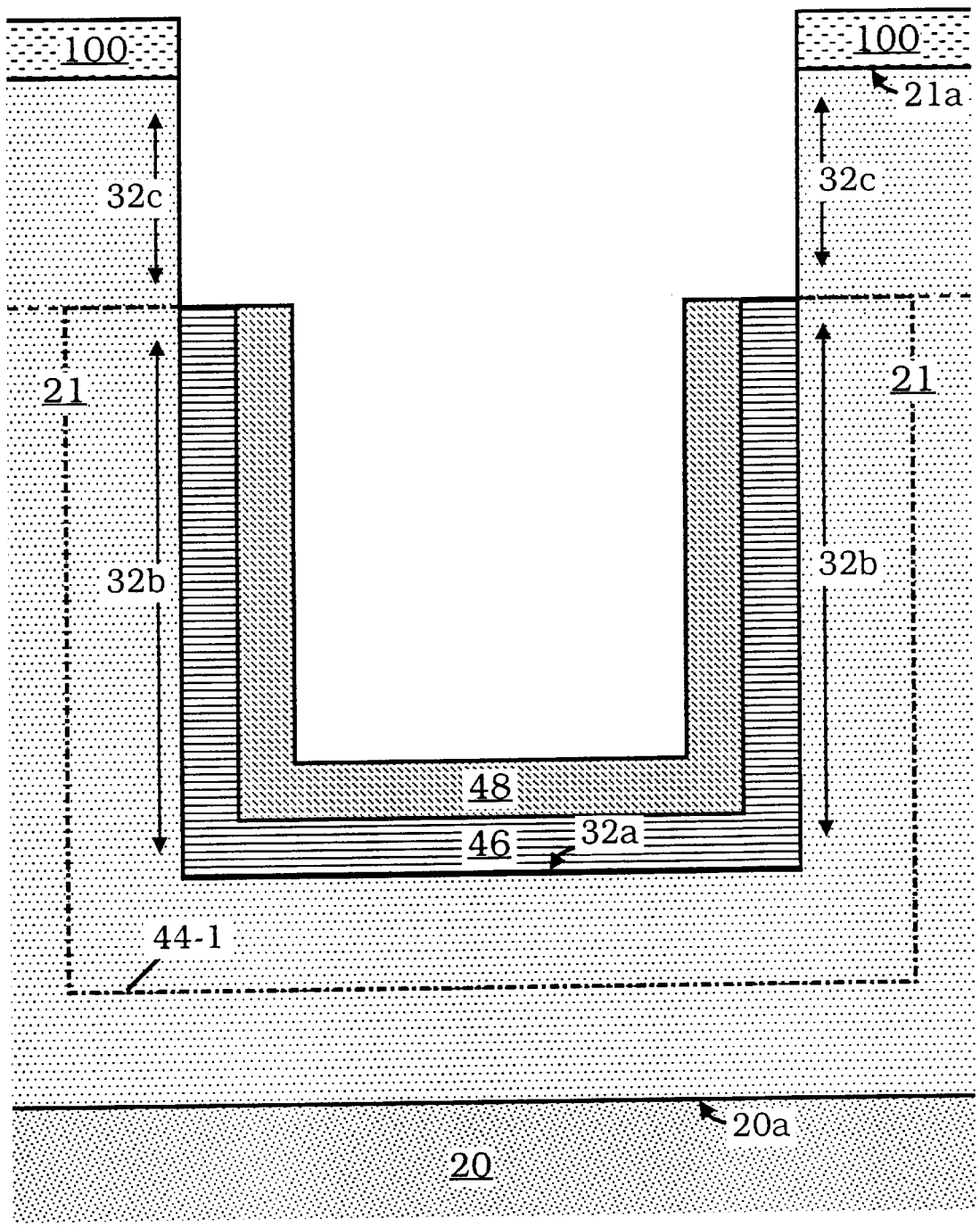

Then, in the transition to the arrangement shown in FIG. 20, the resist layer 110 serves as an etching mask, and an etching operation is carried out in order to etch back the dielectric region 46 and the second electrode region 48 down to the top edge of the lower wall regions or edge regions 32b of the trench 32, so that the material of the upper wall regions or edge regions 32c of the trench 32 is uncovered.

Figure 21:
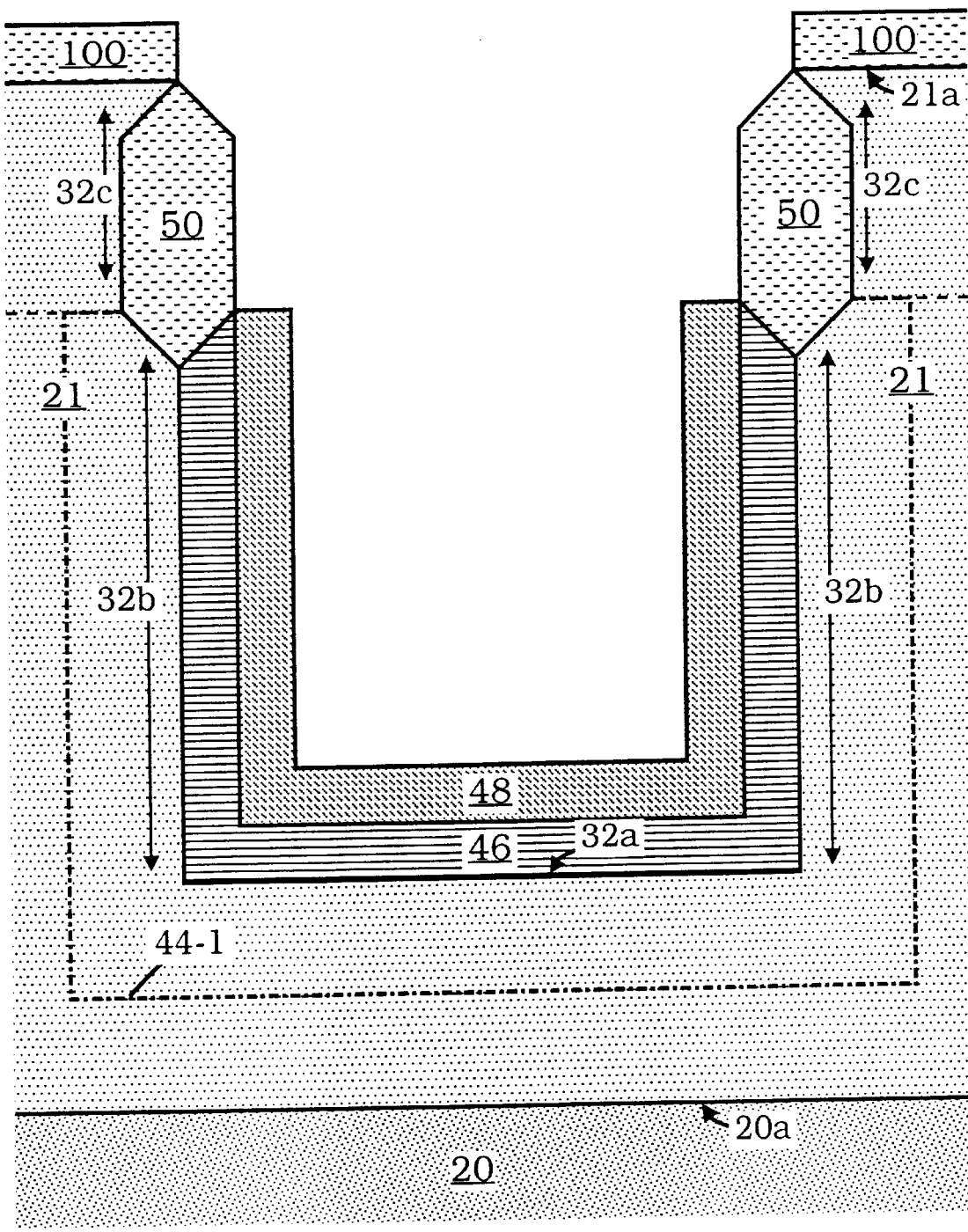

Then, in the transition to the arrangement shown in FIG. 21, oxidation of the material of the upper edge regions or wall regions 32c of the trench 32 is carried out selectively, in order to form the insulation region 50 or collar region 50, the mask layer 100 or the arrangement comprising dielectric region 46 and second electrode region 48 once again protecting the remaining regions of the arrangement from oxidation.

Figure 22:
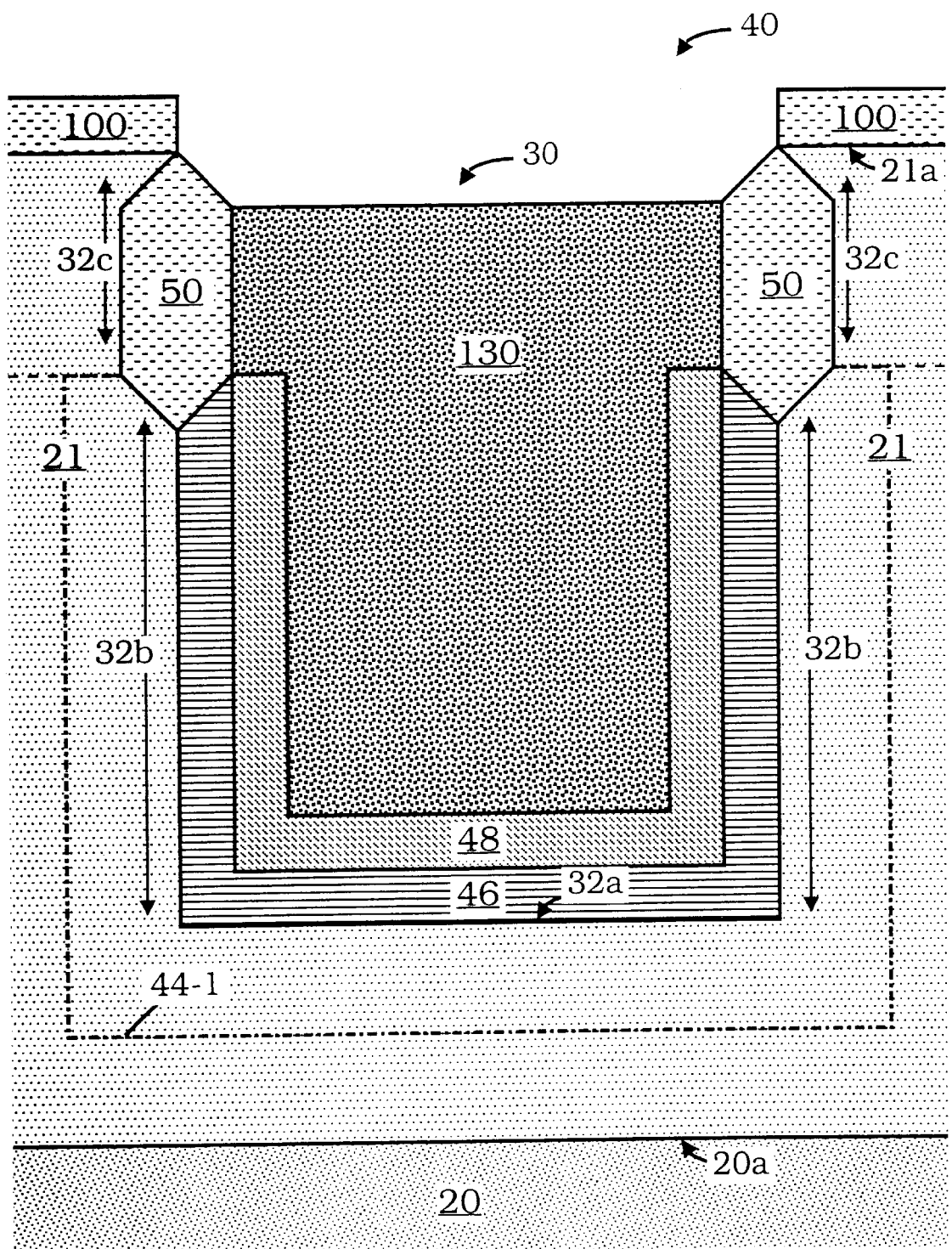

Then, in the transition to the state shown in FIG. 22, the trench 32 is filled with doped polysilicon 130, which is etched back to the top edge of the upper edge regions or wall regions 32c of the trench 32.

The structure can then be processed further in a conventional way, working on the basis of the structure shown in FIG. 22.

We claim:

1. A method of fabricating a trench-structure capacitor device, which comprises:

forming a trench structure with at least one trench in a semiconductor substrate, the trench having a base region, lower wall regions, and upper wall regions;

forming a configuration including a first electrode region, a second electrode region, and a dielectric region therebetween in the trench, wherein at least the lower wall regions and the base region of the trench are lined with a part of the first electrode region, the second electrode region and the dielectric region;

freeing or leaving clear the upper wall regions of material of the first electrode region, of the dielectric region and of the second electrode region, such that a material of the upper wall region of the trench lies exposed;

forming the upper wall region of the trench with an insulation region by selective, thermally induced conversion of the material of the upper wall region;

wherein the first electrode region is formed at least in part from at least one metallic material or metal nitride;

wherein firstly the first electrode region is formed; and the dielectric region is subsequently formed conformally by a process selected from the group consisting of physical, chemical, electrochemical, and oxidative conversion of at least part of the first electrode region.

2. The method according to claim 1, wherein the dielectric region is formed at least in part from a material with a dielectric constant increased relative to $SiO_2$ and $Si_3N_4$.

3. The method according to claim 1, which comprises forming at least one of the first electrode region, the dielectric region, and the second electrode region in layered or multilayered form.

4. The method according to claim 1, which comprises forming at least a portion of the first electrode region by forming a doped area or an $n^+$-doped area in single-crystal silicon in one of the lower wall region and the base region of the trench.

5. The method according to claim 4, wherein the doped area is formed by locally depositing a material region of dopant deposit or an arsenic silicate glass in the lower wall region or in the base region of the trench.

6. The method according to claim 5, which comprises:

introducing the dopant from the dopant deposit into the lower wall regions or into the base region of the trench by thermally induced diffusion; and to thereby form a buried plate structure.

7. The method according to claim 6, which comprises, after the diffusion, specifically removing the dopant deposit from the trench.

8. The method according to claim 4, which comprises forming on the doped area, defining a first part of the first electrode region, a material layer, a metallic material, or a metal nitride, defining a second part of the first electrode region.

9. The method according to claim 1, which comprises forming at least one of the first electrode region, the dielectric region, the second electrode region, and parts thereof substantially conformally.

10. The method according to claim 1, which comprises forming at least one of the first electrode region, the dielectric region, and the second electrode region at least in part by a process selected from the group consisting of deposition, a CVD process, an ALD process, an electrochemical conversion, and a deposition process.

11. The method according to claim 1, which comprises forming at least one of the first electrode region and the second electrode region at least partially from a material selected from the group consisting of Al, Si, W, WN, Ta, TaN, Ti, TiN, Hf, HfN, Zr, ZrN, Mo, MoN, Y, YN, La, LaN, Ce, CeN, TaSiN, WSiN, TiAlN, WSi, MoSi, CoSi, a combination, and a compound thereof.

12. The method according to claim 1, which comprises forming the dielectric region at least in part from a material selected from the group consisting of $Al_2O_3$, AlN, $TiO_2$ $Ta_2O_5$, $HfO_2$, $ZrO_2$, $WO_3$, $MoO_2$, $Y_2O_3$, $La_2O_3$, $CeO_2$, MgO, a combination, and a compound thereof.

13. The method according to claim 1, which comprises forming the insulation region after the first electrode region has been formed.

14. The method according to claim 1, which comprises forming the insulation region after the dielectric and the second electrode region have been formed.

* * * * *